(12) United States Patent
Slocum et al.

(10) Patent No.: US 6,914,785 B1
(45) Date of Patent: Jul. 5, 2005

(54) VARIABLE ELECTRONIC CIRCUIT COMPONENT

(75) Inventors: Alexander H. Slocum, Bow, NH (US); Jeffrey Lang, Sudbury, MA (US); James R. White, Cambridge, MA (US); Hong Ma, Cambridge, MA (US); Xueen Yang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/683,569

(22) Filed: Oct. 10, 2003

Related U.S. Application Data
(60) Provisional application No. 60/417,876, filed on Oct. 11, 2002.

(51) Int. Cl.[7] ................................................. H05K 1/18
(52) U.S. Cl. ..................... 361/762; 361/306.3; 361/720; 361/758; 361/770; 361/804; 174/252; 174/256; 174/259
(58) Field of Search ................................ 361/762, 720, 361/730, 760, 758, 803, 784, 810, 832, 770, 767; 174/252, 254–256, 259

(56) References Cited

U.S. PATENT DOCUMENTS

| | | | | |
|---|---|---|---|---|
| 5,065,282 A | * | 11/1991 | Polonio | ....................... 361/752 |
| 5,432,677 A | * | 7/1995 | Mowatt et al. | ............. 361/719 |
| 6,809,937 B2 | * | 10/2004 | Augustin et al. | ........... 361/832 |
| 6,813,162 B2 | * | 11/2004 | Deeney | ....................... 361/762 |
| 6,822,878 B2 | * | 11/2004 | Dobbs et al. | ................ 361/807 |

* cited by examiner

Primary Examiner—Eric W. Thomas
Assistant Examiner—Nguyen T. Ha
(74) Attorney, Agent, or Firm—Daly, Crowley, Mofford & Durkee, LLP

(57) ABSTRACT

A circuit component has an elastically deformable first structure, a second structure, and a support structure coupling the first and second structures, wherein the support structure acts a fulcrum about which the first structure can be variably deformed in response to a variable force, to provide either a variable capacitor or a variable tank circuit having a variable capacitor and an inductor. In one particular embodiment, the circuit component includes a zipper actuator for elastically deforming the first structure. A method of making a circuit component includes forming an elastically deformable first structure, forming a second structure, and forming a support structure coupling the first and second structures, to provide either a variable capacitor or a variable tank circuit having a variable capacitor and an inductor. In one particular embodiment, the method includes forming a zipper actuator for elastically deforming the first structure.

6 Claims, 19 Drawing Sheets

— Experimental Results
······ Theory

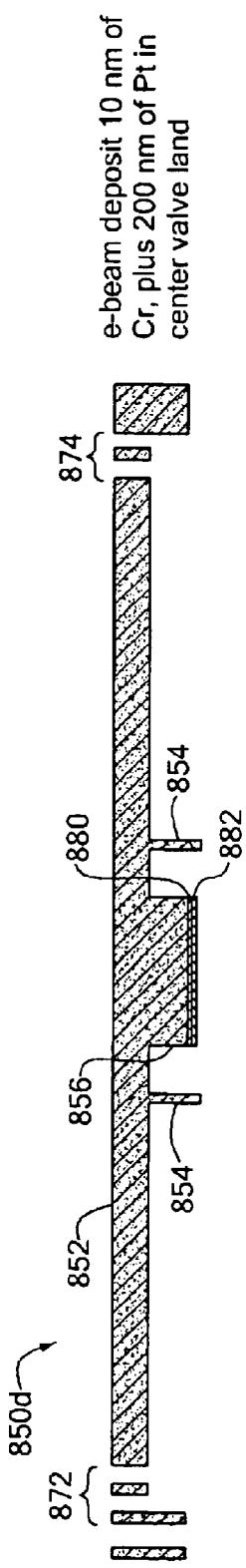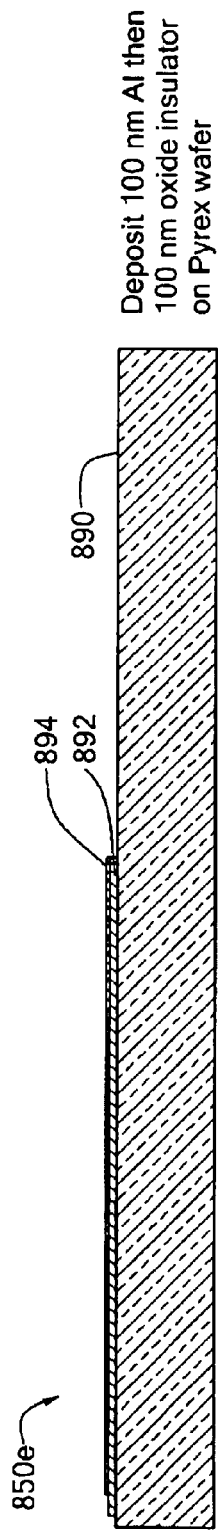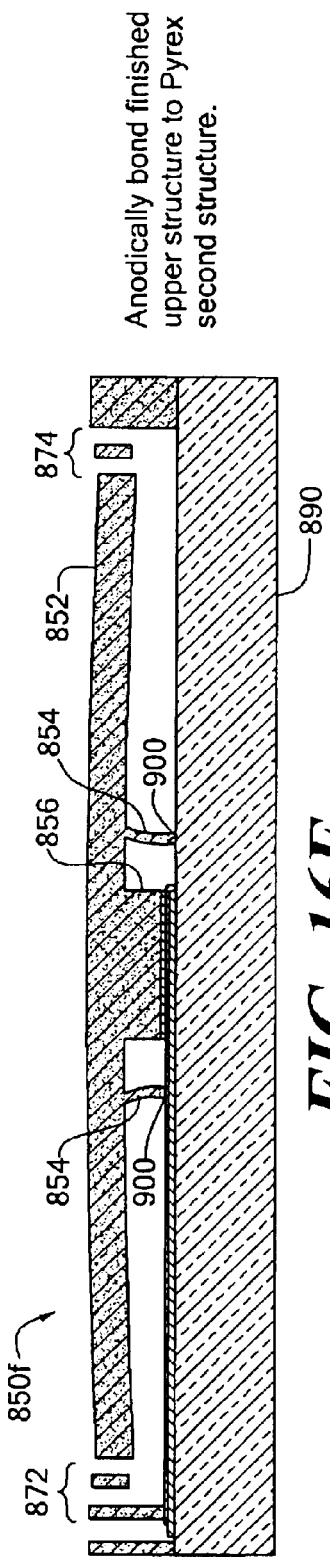

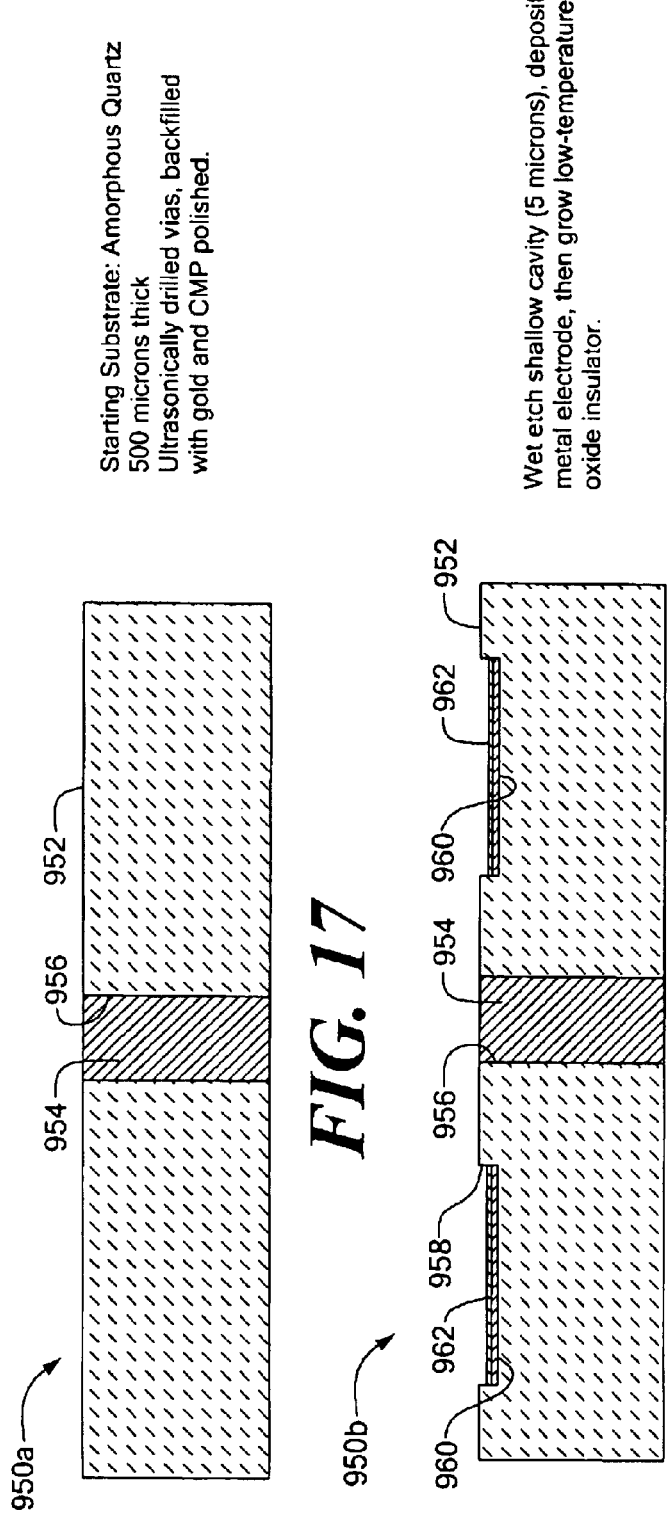
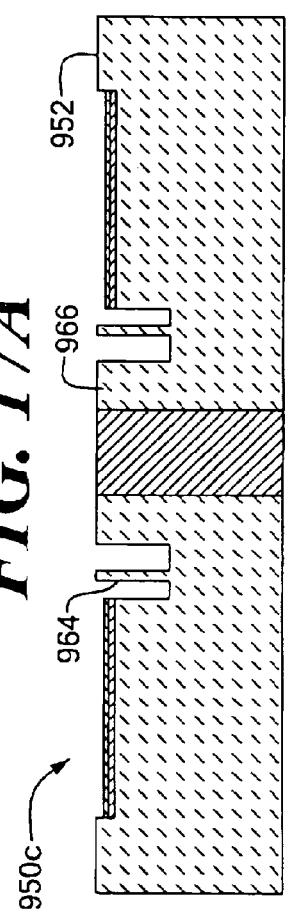
FIG. 17 — Starting Substrate: Amorphous Quartz 500 microns thick. Ultrasonically drilled vias, backfilled with gold and CMP polished.
FIG. 17A — Wet etch shallow cavity (5 microns), deposit metal electrode, then grow low-temperature oxide insulator.
FIG. 17B — Deep RIE (AOE) etch quartz to define support structure, 100 microns deep.

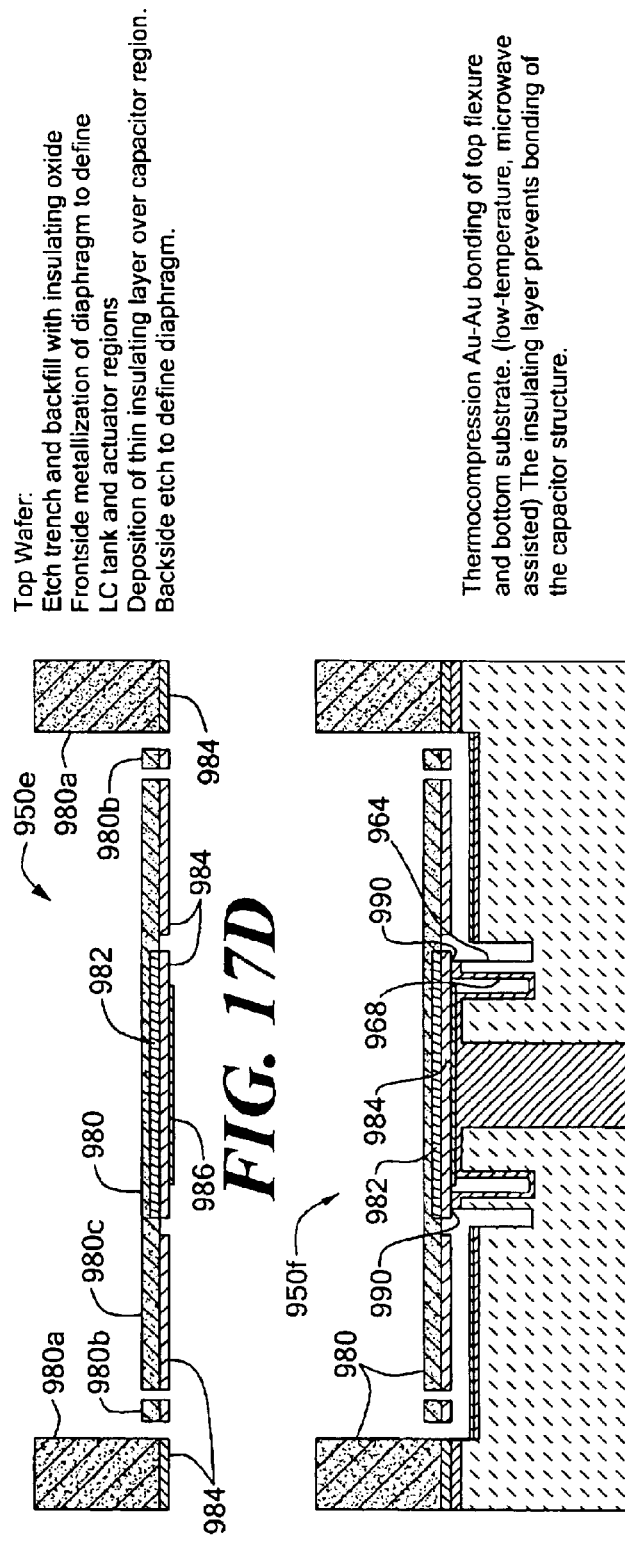

FIG. 17C Sputter Ti/Pd seed layer through shadow mask; electroless plate gold metallization. Finished bottom wafer.

FIG. 17D Top Wafer:
Etch trench and backfill with insulating oxide
Frontside metallization of diaphragm to define LC tank and actuator regions
Deposition of thin insulating layer over capacitor region.
Backside etch to define diaphragm.

FIG. 17E Thermocompression Au-Au bonding of top flexure and bottom substrate. (low-temperature, microwave assisted) The insulating layer prevents bonding of the capacitor structure.

VARIABLE ELECTRONIC CIRCUIT COMPONENT

CROSS REFERENCE TO RELATED APPLICATIONS

This application claims the benefit under 35 U.S.C. §119 (e) of U.S. Provisional Application No. 60/417,876 filed Oct. 11, 2002.

STATEMENT REGARDING FEDERALLY SPONSORED RESEARCH

This invention was made with government support under Contract No. DMI-0002934 awarded by the National Science Foundation. The government has certain rights in the invention.

FIELD OF THE INVENTION

This invention relates generally to electronic circuit components, and more particularly to variable capacitors and variably tunable tank circuits.

BACKGROUND OF THE INVENTION

Many electronic communications systems require the ability to tune one or more of their circuits to selectively receive a narrow band channel within a plethora of channels in the radio spectrum. For example, a conventional radio receiver is designed to manually or automatically tune to enable reception of a selected radio signal from among many radio signals. Once the correct frequency is reached, the signal can be received down-converted to an audio signal, and presented to a user for listening. As is known, the many radio signals span a relatively wide frequency range, while each individual radio signal spans a relatively narrow frequency range, each having a different center frequency.

While the conventional radio receiver has selective tuning to tune near selected ones of the many radio signals, i.e. with selective "coarse" tuning, it should also be appreciated that the conventional radio receiver also has selective "fine" tuning, to tune within a narrower frequency range. Such fine tuning can variably move a tuned center frequency, first selected by the coarse tuning, to more accurately select a particular center frequency.

As is known, fixed electrical components suffer from component value drift with time and temperature, which can result in drift of a tuned circuit. With the selectable tuning described above, tuning drift can be overcome, and a tuning circuit, regardless of component drift, can still tune to a desired center frequency.

The radio receiver is but one example of a wide variety of electronic devices that require the ability to tune to selected frequencies. Other examples include, but are not limited to, radio transmitters, wireless telephones (voice and data), wireless modems, wireless LAN access points, analog cable modems, radar systems, and scientific instruments, and could all make use of and are based upon the design and construction and operation disclosed in earlier U.S. Pat. No. 5,964,242 of applicant Alexander H. Slocum herein.

Some characteristics that are important in determining the effectiveness of an electronic tuning circuit include a total frequency span over which the selective tuning can tune, i.e., a coarse tuning range, an accuracy of the tuning, i.e. a fine tuning range and accuracy, and a selectivity of the tuning. The selectivity will be understood to be characterized by a Q factor (or more simply "Q"), associated with a bandwidth of the tuning.

Conventional electronic circuits are known which can provide selective coarse tuning over a wide range of frequencies, but with only a relatively low Q. For example, a phase locked loop (PLL), having a programmable divider, can provide selective tuning in a relatively wide range of frequencies. Conventional electronic circuits are also known which can provide selective tuning over only a small range of frequencies, but with a high Q. For example, a varactor diode is known to provide a variable capacitance, which can be used in conjunction with a fixed inductor and other electronic components in a resonant tank circuit to provide selective fine tuning. To this end, there also exist other passive components used in tank circuits (e.g. crystals, surface acoustic wave (SAW) devices, and bulk acoustic mechanical resonators), which provide relatively high Q (on the order of a thousand), low noise, and high stability necessary for highly-selective, low-loss fine tuning at radio frequencies (RF) and intermediate frequencies (IF). While a high Q is obtained with tank circuits, if used in a radio receiver without coarse tuning circuitry, the tank circuit could not tune over the full AM and FM frequency bands. Therefore, it should be understood that with conventional circuits a tradeoff must be made between total tuning frequency range and Q.

In order to achieve both a wide range of tuning and a high Q, many conventional electronic circuits incorporate both coarse tuning circuits, which conventionally have a wide tuning range but low Q, and fine tuning circuits, which conventionally have a low tuning range but a high Q. It will, however, be understood that the coarse tuning circuits and fine tuning circuits in combination represent a relatively complex and expensive electronic structure.

To replace the circuits described above, micro electromechanical systems (GEMS) have provided on-chip voltage-tunable capacitors, low-loss inductors, and on-chip mechanical resonators. MEMS capacitors with a tuning range of approximately 3:1 at radio frequencies (RF) are known. While performance of RF MEMS capacitors and inductors have been demonstrated to be superior to those provided by conventional IC technologies, the range of achievable Q at high frequencies has been relatively low with known MEMS structures.

It would, therefore, be desirable to overcome the aforesaid and other disadvantages, and to provide an electronic circuit component capable of providing a relatively wide tuning range and a relatively high Q.

SUMMARY OF THE INVENTION

The present invention provides a tunable capacitor and/or a tunable tank circuit capable of tuning at relatively high signal frequencies, over a relatively wide range of frequencies, and with a relatively high Q factor, fabricated using micro electromechanical systems (MEMS) technology.

In accordance with the present invention, a circuit component has a first structure provided from an elastically deformable material. The circuit component also has a second structure with a surface proximate a surface of the first structure. The first and the second structures are coupled with a support structure, which acts as a fulcrum over which the first structure can be elastically deformed, causing a portion of the surface of the first structure to move relative to, and apart from, the surface of the second structure, forming a gap. In one particular embodiment, the smallest possible gap is only a few nanometers in size and controllable with sub-nanometer accuracy over hundreds of nanometers. In one particular embodiment, the surface of the first structure and the surface of the second structure which are in proximity, each have a conductive region, separated by an insulating layer which prevents electrical breakdown between said conducting regions, thereby forming a capacitor, the value of which varies in proportion to the movement of the first structure relative to the second structure. In another embodiment, the surface of the first structure and the surface of the second structure which are in proximity, each also have another conductive region, forming an inductor in parallel with the capacitor, and therefore, forming a tank circuit. In yet another embodiment, the circuit component includes an electrostatic "zipper actuator" for elastically deforming the first structure.

With this particular arrangement, a MEMS capacitor having a selectably variable capacitance value is provided. The capacitor can be provided as part of a variable tank circuit having a relatively wide tuning range and a relatively high Q.

In accordance with another aspect of the present invention, a method for making a circuit component includes processing an elastically deformable wafer having first and second opposing surface to provide a first structure, and also forming a second structure having first and second opposing surfaces. The method further includes processing either of the first structure and the second structure to provide a support structure, and bonding the support structure to the other one of the first structure and the second structure such that the support structure acts as a fulcrum about which the first structure can be elastically deformed. When the first structure is elastically deformed, a portion of the first surface of the first structure moves relative to the first surface of the second structure, forming a gap. In one particular embodiment, the gap is only a few nanometers in size and controllable on a nanometer scale. In one particular embodiment, the method also includes processing the first surface of the first structure to provide a first conductive region, and processing the first surface of the second structure to provide a second conductive region, so that the first conductive region and the second conductive region form a capacitor. In another particular embodiment, the method further includes processing the first surface of the first structure to provide a third conductive region coupled to the first conductive region, and processing the first surface of the second structure to provide a fourth conductive region coupled to the second conductive region, so that the third and fourth conductive regions form an inductor, which is in parallel with the capacitor. In another particular embodiment, the method includes forming a zipper actuator for elastically deforming the first structure.

With this particular arrangement, the method provides a variable capacitor and/or a variable tank circuit having a relatively wide tuning range and a relatively high Q.

BRIEF DESCRIPTION OF THE DRAWINGS

The foregoing features of the invention, as well as the invention itself may be more fully understood from the following detailed description of the drawings, in which:

FIGS. 17–17E are a series of cross-sectional views showing steps performed to fabricate the circuit component of FIGS. 2 and 2A;

DETAILED DESCRIPTION OF THE INVENTION

Before describing the circuit components of the present invention, mention is made as to the format of some of the figures. Those figures shown and described as cross-sectional figures are drawn without some lines representing features behind the section region. Those lines behind the section region, if drawn, would add unnecessary complexity to the drawings and mask the features which are described.

In effect, the cross-sectional figures may be thought of as "slice" figures, representing a slice of an apparatus.

Figure 1:
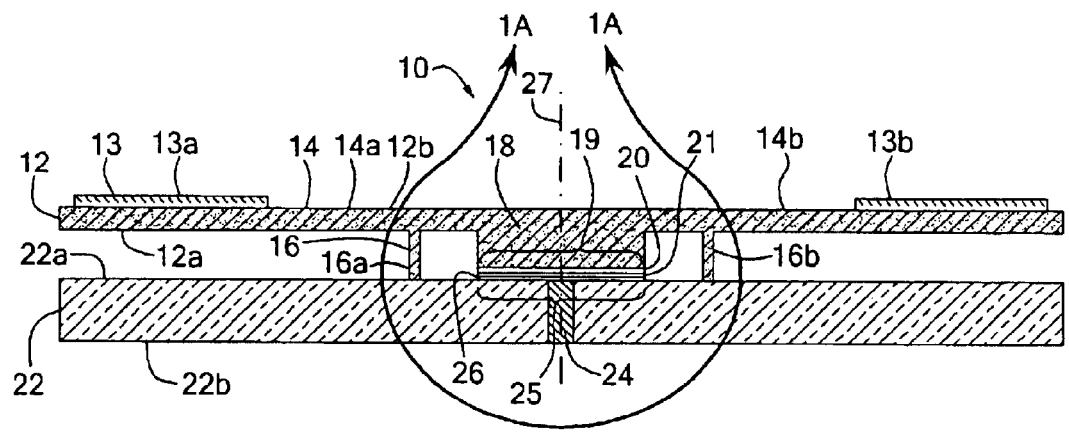
FIG. 1 is a cross-sectional view of an exemplary capacitor, shown in a relaxed state.
Figure 1A:
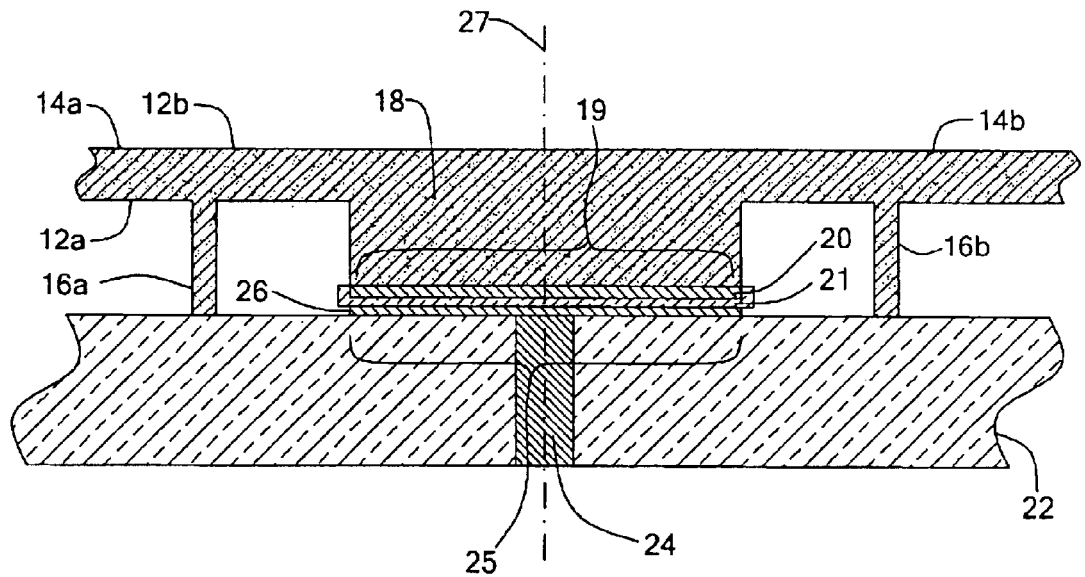
FIG. 1A is a cross-sectional view of a portion of the capacitor shown in FIG. 1.

Referring now to FIGS. 1 and 1A, an exemplary circuit component 10 includes a first (or upper) structure 12, provided from an elastically deformable material, having a first surface 12a and a second surface 12b. The first structure 12 has lever regions 14a, 14b, collectively 14, and a central region 18, which, in this particular embodiment, is shown to be thicker than the lever regions 14. A portion 19 of surface 12a of the upper structure 12 has a first conductive layer 20 disposed thereon. The first conductive layer 20 is shown in greater detail in conjunction with FIG. 1A.

The exemplary circuit component 10 also includes a second (or lower) structure 22, having a first surface 22a and a second surface 22b. A portion 25 of the first surface 22a of the second structure 22 has a second conductive layer 26 disposed thereon. The second conductive layer 26 is also shown in greater detail in FIG. 1A. A conductive via 24 provides an electrical contact path to the second conductive layer 26. An insulator layer 21 disposed between conductive layers 20 and 26, prevents the first and second conductive layers 20, 26 from coming into physical contact with each other, and also provides improved dielectric breakdown strength.

Support structures 16a, 16b are coupled to both the first structure 12 and the second structure 22. The support structures 16a, 16b act as fulcrums about which the first structure 12 can be elastically deformed in response to a force, causing at least the portion 19 of the first surface 12a of the first structure 12 to move relative to the portion 25 of the first surface 22a of the second structure 22 in a direction of an axis 27.

In one exemplary embodiment, the force can be provided by piezoelectric elements 13a, 13b coupled to the second surface 12b of the first structure 12. In response to a signal provided thereto, one or both of the piezoelectric elements provide a force upon the first structure 12 in the lever regions 14a, 14b. The force is described in greater detail in conjunction with FIG. 1B below. While piezoelectric elements 13a, 13b are shown, in other embodiments, a so-called "zipper actuator" can be provided in place of, or in addition to, the piezoelectric elements 13a, 13b to provide the force upon the first structure 12. An exemplary zipper actuator is described below in conjunction with FIGS, 4, 4A, and 8.

In one particular embodiment, the circuit component 10 is symmetrical about the axis 27. In another embodiment, the circuit component 10 can be provided having circular symmetry about the axis 27, and thus the circuit component 10 is essentially cylindrical. In the embodiment where there is circular symmetry, the lever regions 14a, 14b are provided from a single structure as one lever region 14, and the support structures 16a, 16b are provided from a single structure 16, having a ring shape. Also, the piezoelectric elements 13a, 13b can correspond to one piezoelectric element 13.

In one particular embodiment, the first structure 12 is made from silicon using integrated circuit processing techniques, for example, techniques similar to those described below in conjunction with FIGS. 16–16E, and the second structure 22 is made from glass, for example, PYREX® glass made by Corning®, Inc, made with glass processing techniques also described below in conjunction with FIGS. 16–16E. In another embodiment, both the first and the second structures 12, 22 are made from silicon. In another embodiment, the second structure 22 is made from quartz.

In one particular embodiment, the support structure 16 is an integral part of the first structure 12 and is made from silicon using integrated circuit processing techniques. Where the second structure 22 is glass or quartz as described above, the support structure 16 can be coupled to the second structure 22 with anodic bonding techniques or thermocompression techniques. Where the second structure 22 is silicon, also as described above, the support structure 16 can be coupled to the second structure 22 with fusion bonding techniques. In another embodiment, the support structure 16 can be provided as an integral part of the second structure 22.

Figure 1B:
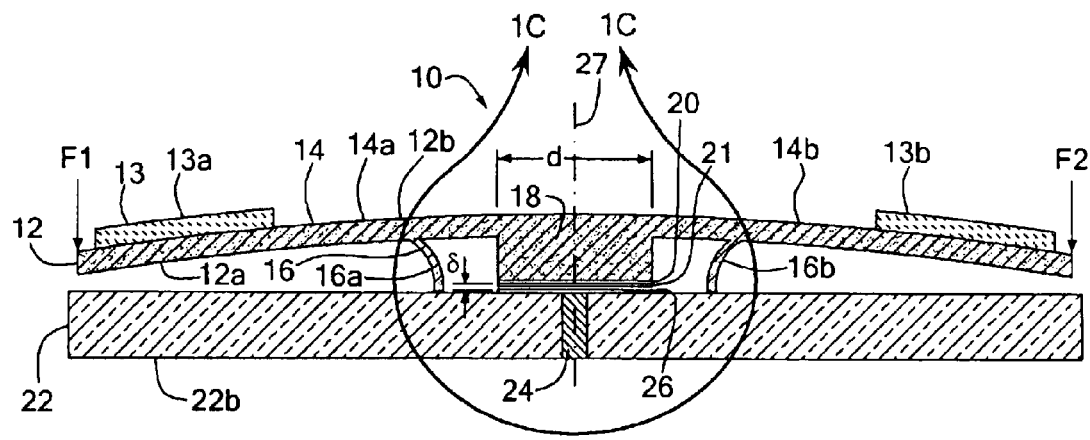
FIG. 1B is a cross-sectional view of the capacitor of FIG. 1, shown in a deformed state.
Figure 1C:
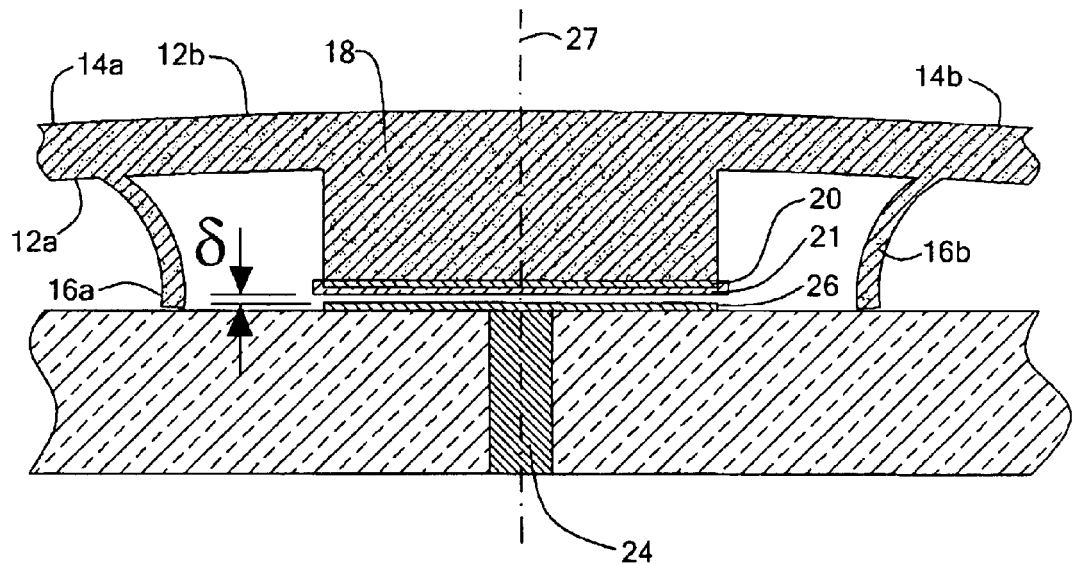
FIG. 1C is a cross-sectional view of a portion of the capacitor shown in FIG. 1B.

Referring now to FIGS. 1B and 1C, in which like elements of FIGS. 1 and 1A are shown having like reference designations, deflection forces F1, F2 are applied to the lever regions 14a, 14b (e.g., by the optional piezoelectric elements 13a, 13b), causing separation of the first and second conductive layers 20, 26 respectively, forming a gap δ. It will be understood that the size of the gap δ is influenced by the magnitude of the forces F1, F2. Therefore, the layers 20, 21, and 26 form a variable capacitor having a capacitance that varies in proportion to the forces F1, F2. As the forces F1, F2 increase, the gap δ tends to increase, therefore reducing the capacitance.

As described above, in other embodiments, the forces F1, F2 can equally well be applied with another type of actuator in place of or in addition to the piezoelectric elements 13a, 13b. For example, in other embodiments, the forces F1, F2 can be applied with a zipper actuator as shown and described in conjunction with FIGS. 4, 4A, and 8, or with an electromechanical actuator (not shown).

Because the gap δ of the circuit component 10 has a high aspect ratio, i.e., a major axis or a diameter d much greater than the gap δ, which can be precisely controlled, the circuit component 10 can form a capacitor having a relatively wide range of achievable capacitance values. A tuning ratio can be defined as the largest capacitance value which can be achieved divided by the smallest capacitance value which can be achieved, and the capacitor 10 is provided having a relatively high tuning ratio. In one particular embodiment, the tuning ratio is 100:1. With the addition of an integral inductor as described more fully below, a tunable LC resonator circuit, or LC tank circuit, can operate from UTHF (Ultra-High Frequency) to SHF (Super-High Frequency) and is capable of band selection over a wide frequency range. It should, however, be appreciated that the structures and techniques described herein can also be applied to frequency ranges which are lower than and higher than UHF and SHF.

In figures below, it will become apparent that additional features can be added to the structure of FIGS. 1 and 1B in order to form an inductor in parallel with the variable capacitor.

Figure 2:
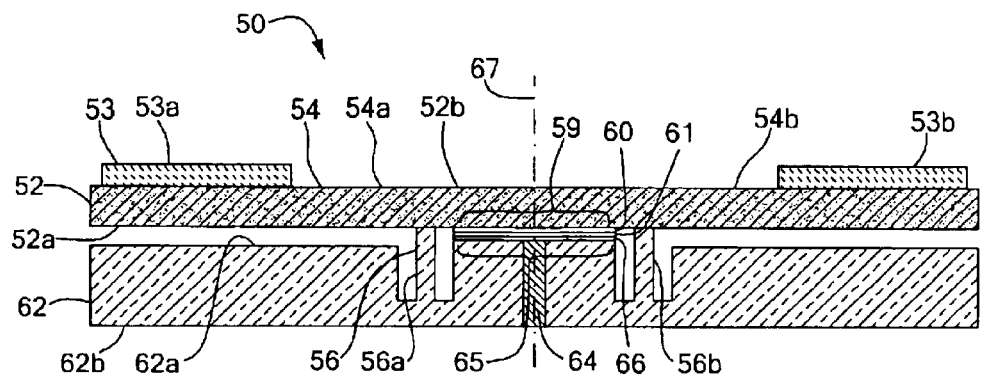
FIG. 2 is a cross-sectional view of another exemplary capacitor, shown in a relaxed state.

Referring now to FIG. 2, another exemplary circuit component 50 includes a first (or upper) structure 52, provided from an elastically deformable material, having a first surface 52a and a second surface 52b. The first structure 52 has lever regions 54a, 54b, collectively 54. A portion 59 of the surface 52a of the upper structure 52 can have a first conductive layer 60 disposed thereon. The first conductive layer 60 is similar to conductive layer 20 described above in conjunction with FIGS. 1–1C.

The exemplary circuit component 50 also includes a second (or lower) structure 62, having a first surface 62a and a second surface 62b. A portion 65 of the first surface 62a of the second structure 62 can have a second conductive layer 66 disposed thereon. The second conductive layer 66 is similar to layer 26 described above in conjunction with FIGS. 1–1C. A metal plugged via 64 provides an electrical contact path to the second conductive layer 66. In an alternate arrangement, the via 64 is a plated via, not fully plugged with metal. An insulator layer 61 disposed on the first conductive layer 60 separates the first and second conductive layers 60, 66 respectively.

Support structures 56a, 56b are disposed between the first and second structures 52, 62. The support structures 56a, 56b act as fulcrums about which the first structure 52 can be elastically deformed in response to a force, causing at least the portion 59 of the first surface 52a of the first structure 52 to move relative to the portion 65 of the first surface 62a of the second structure 62 in a direction of an axis 67.

Piezoelectric elements 53a, 53b are coupled to the second surface 52b of the first structure 52 in order to provide a force upon the first structure 52 in the lever regions 54a, 54b. The force is described in greater detail in conjunction with FIG. 2A below. While piezoelectric elements 53a, 53b are shown in the exemplary embodiment of FIGS. 2–2A, in other embodiments, a zipper actuator can be provided in place of, or in addition to, the piezoelectric elements 53a, 53b to provide the force upon the first surface 52a. An exemplary zipper actuator is described below in conjunction with FIGS. 4, 4A, and 8.

In one particular embodiment, the circuit component 50 is symmetrical about the axis 67. In another embodiment, the circuit component 50 can be provided having circular symmetry about the axis 67 and thus the circuit component 50 is essentially round. With this arrangement, the lever regions 54a, 54b can be provided from a single structure as one lever region 54, and the support structures 56a, 56b can be provided from a single structure 56, having a ring shape. Also, the piezoelectric elements 53a, 53b can be provided from a single structure corresponding to a piezoelectric element 53 having an annular or circular shape.

In one particular embodiment, the first structure 52 is made from silicon using integrated circuit processing techniques, for example, techniques shown in FIGS. 17–17E below, and the second structure 62 is made from quartz with quartz processing techniques also shown in FIGS. 17–17E. In another embodiment, both the first and the second structures 52, 62 are made from silicon. In another embodiment, the second structure 62 is made from glass, for example, PYREX® glass, made by Corning®, Inc.

In one particular embodiment, the support structure 56 is an integral part of the second structure 62 and is made from quartz or glass, and the support structure 56 can be coupled to the first structure 52 with thermocompression techniques or anodic bonding techniques. Where the second structure 62 is silicon and the support structure 56 is also silicon, the support structure 56 can be coupled to the first structure 52 with fusion bonding techniques.

Figure 2A:
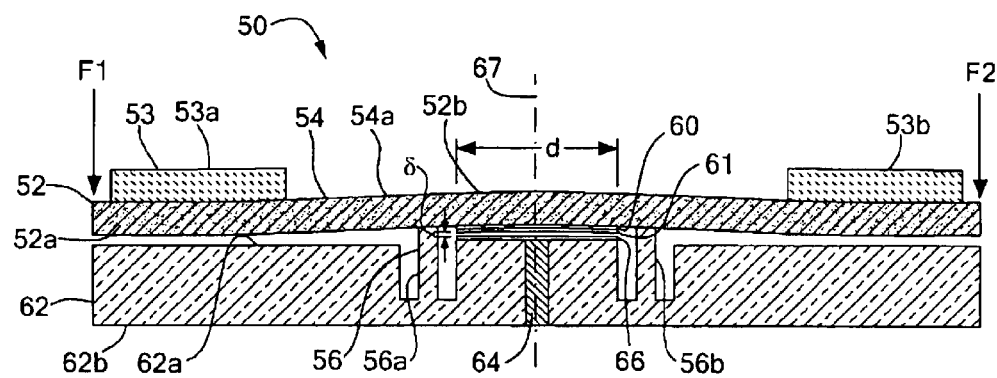
FIG. 2A is a cross-sectional view of the capacitor of FIG. 2, shown in a deformed state.

Referring now to FIG. 2A, in which like elements of FIG. 2 are shown having like reference designations, deflection forces F1, F2 are applied to the lever regions 54a, 54b of the first structure 52, respectively, causing separation of the first and second conductive layers 60, 66, respectively, forming a gap having a width δ. It will be understood that the size of the gap width δ is influenced by the magnitude of the forces F1, F2. Therefore, the conductive layers 60, 66 form a capacitor having a capacitance that varies in proportion to the forces F1, F2. As the forces F1, F2 increase, the gap width δ tends to increase, therefore reducing the capacitance.

As described above, in other embodiments, the forces F1, F2 can equally well be applied with another type of actuator in place of or in addition to the piezoelectric elements 53a, 53b. For example, in other embodiments, the forces F1, F2 can be applied with a zipper actuator as shown and described in conjunction with FIGS. 4, 4A, and 8, or with an electromechanical actuator (not shown).

In figures below, it will become apparent that additional features can be added to the structure of FIGS. 2 and 2A in order to form an inductor in parallel with the variable capacitor.

Because the gap width δ of the circuit component 50 has a high aspect ratio, i.e., a dimension d greater than the gap width δ, which can be precisely controlled, the circuit component 50 can form a capacitor having a high tuning-ratio. In one particular embodiment, the tuning ratio is 100:1. With addition of an integral inductor as will he described below, a tunable LC resonator comprised of a fixed inductor connected in parallel with a variable capacitor, or LC tank, can operating from UHF (Ultra-High Frequency) to SHF (Super-High Frequency) and is capable of band selection over a wide frequency range. It should, however, be appreciated that the structures and techniques described herein can also be applied to frequency ranges both lower and higher than the UHF and SHF frequency ranges.

Figure 3:
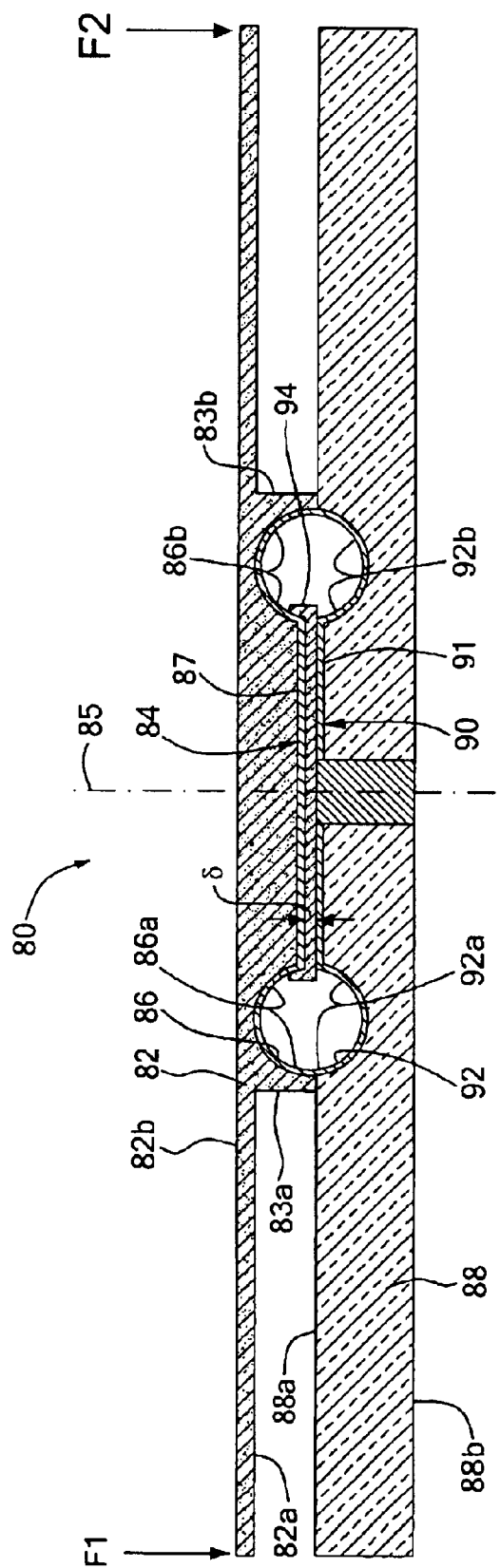
FIG. 3 is a cross-sectional view of an exemplary tank circuit provided from a capacitor and an inductor.

Referring now to FIG. 3, another circuit component 80 includes a first structure 82 coupled to a second structure 88 with support structures 83a, 83b. The support structures 83a, 83b can be the same as or similar to the support structures 16a, 16b of FIGS. 1 and 1A.

Each of the structures 82, 88 are provided having semi-circular regions in which conductive material 86a, 86b, 92a, 92b are disposed. The semicircular shaped regions, when joined together forming a circular region, form a circuit element having an inductive characteristic.

Similarly, each of the structures 82, 88 are provided having flat regions 84, 90 in proximity to each other. The flat regions 84, 90 are also provided having conductive material 87, 91 disposed thereover. Thus, a circuit component having a capacitance characteristic is provided. The capacitance of the capacitor is proportional to the gap width δ, which in turn is proportional to the forces F1, F2 as described above in conjunction with FIGS. 1–1C.

Conductive regions 86a, 86b disposed on the first surface 82a of the first structure 82 are coupled to the conductive region 87. Conductive regions 92a, 92b disposed on the first surface 88a of the second structure 88 are coupled to the conductive region 91. Thus, the conductive regions 86, 92, respectively form an inductor in parallel with the capacitor formed by the first and second conductive regions 84, 90, respectively.

An insulating layer 94 separates the conductive layers 87, 91, and extends around the edge of the conductive layer 87 to prevent a short circuit between the conductive layers 87, 91, and also reduce fringing effects.

As described above, it should be understood that the circuit component 80 can be symmetrical about an axis 85. In one embodiment, the component 80 is circularly symmetric about the axis 85. In this case, the component 80 is provided having a substantially round shape, in which case, the support structures 83a, 83b can be provided from a single structure having a ring shape, the conductor in regions 86a, 86b can be provided as a single conductor 86, and the conductor in regions 92a, 92b can be provided as a single conductor 92.

As described above in conjunction with FIG. 1A, forces F1, F2 can be applied to the first structure 82, elastically deforming the first structure 82, resulting in an increase of the gap width δ, and a corresponding decrease in capacitance of the capacitor formed by the first and second conductive regions 87, 91. When the first structure is deformed in this way, the inductance of the inductor formed by the conductive regions 86, 92 can remain essentially constant.

Also as described above, the forces F1, F2 can be applied in a variety of ways, including, but not limited to, piezoelectric elements (FIGS. 1, 1A, 2, 2A), zipper actuators (FIG. 4, 4A, 8), and electromagnetic actuators (not shown).

Figure 6:
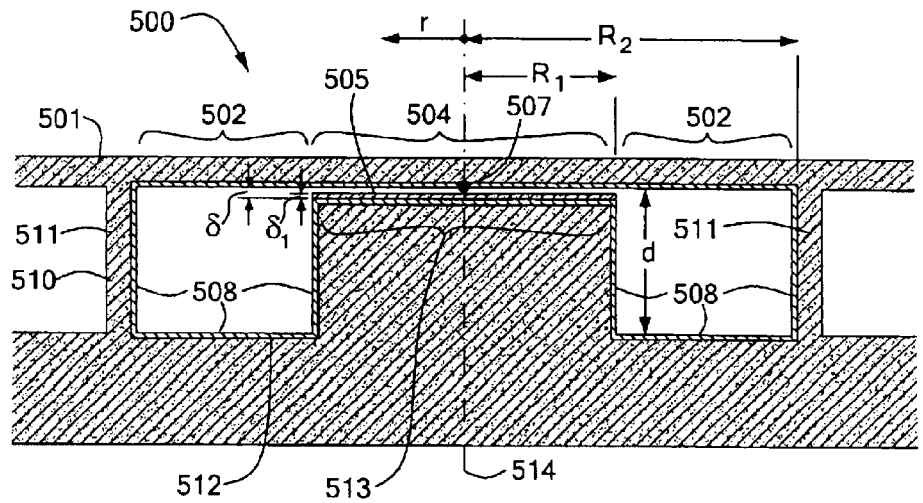
FIG. 6 is a cross-sectional view of a portion of an exemplary circuit component, which can be the same as or similar to a portion the tank circuit of FIGS. 4, 4A, and 5.

The inductor formed by the conductive regions 86, 92 is described in greater detail in conjunction with FIG. 6. In one exemplary embodiment, the inductor formed by the conductive regions 86, 92 is a single-turn inductor, L, operating as a resonant cavity, with an inductor Q on the order of one hundred.

The circuit component 80 forms a tunable LC tank circuit, which, in one particular arrangement, can be driven actively in a tunable oscillator. As is known, in a super-heterodyne radio receiver, channel selection is governed by tuning of a variable local oscillator (LO) to down-convert a received radio signal into the pass band of an intermediate frequency filter. In one particular embodiment, the circuit component 80 can be used in an LC tank based oscillator that can span from 2 to 10 GHz.

Figure 4:
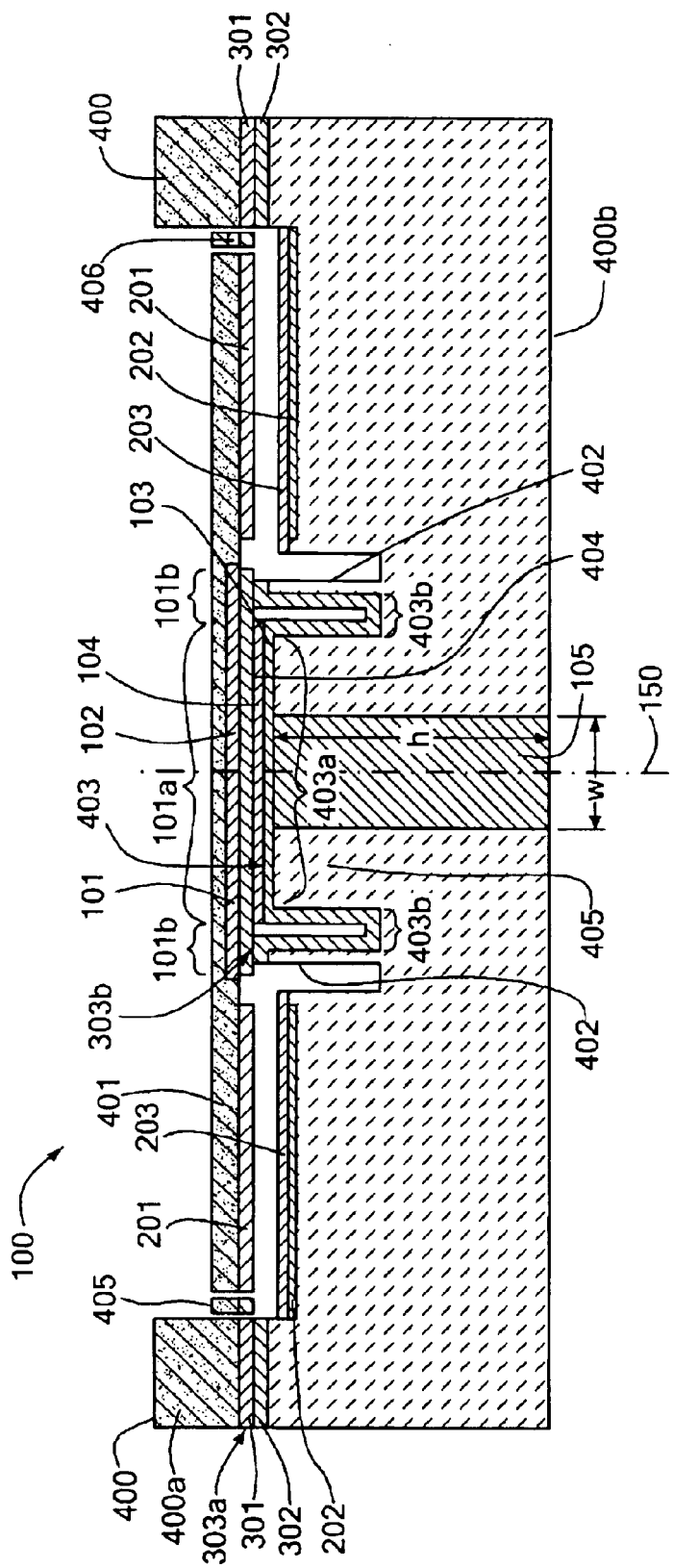
FIG. 4 is a cross-sectional view of yet another exemplary tank circuit, shown in a relaxed state.
Figure 4A:
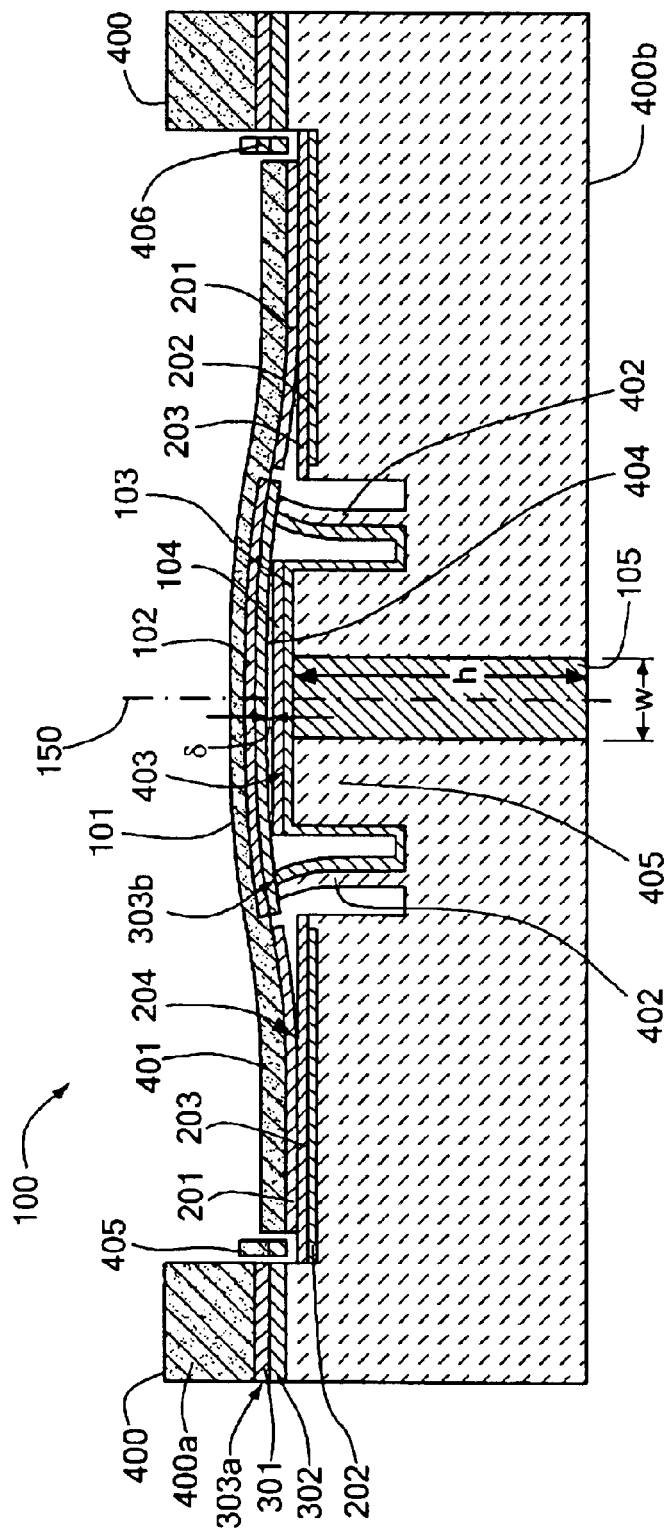
FIG. 4A is a cross-sectional view of the exemplary tank circuit of FIG. 4 shown in a deformed state and having a zipper actuator.

Referring now to FIGS. 4 and 4A in which like elements are provided having like reference designations, an exemplary circuit component 100 includes a first structure 400a having disposed thereon a conductive layer 201, a first conductive region 101a, an insulator layer 104, and a third conductive region 101b. In one particular embodiment, the first and third conductive regions 101a, 101b respectively can be formed as a single conductive layer 101, or are otherwise coupled together. In one particular embodiment, an insulating layer 102 can be formed on the first structure 400a in contact with the first conductive region 101a. The conductive layer 201 forms a first portion of a zipper actuator, further described below. The first structure 400a can also include a conductive layer 301.

Figure 5:
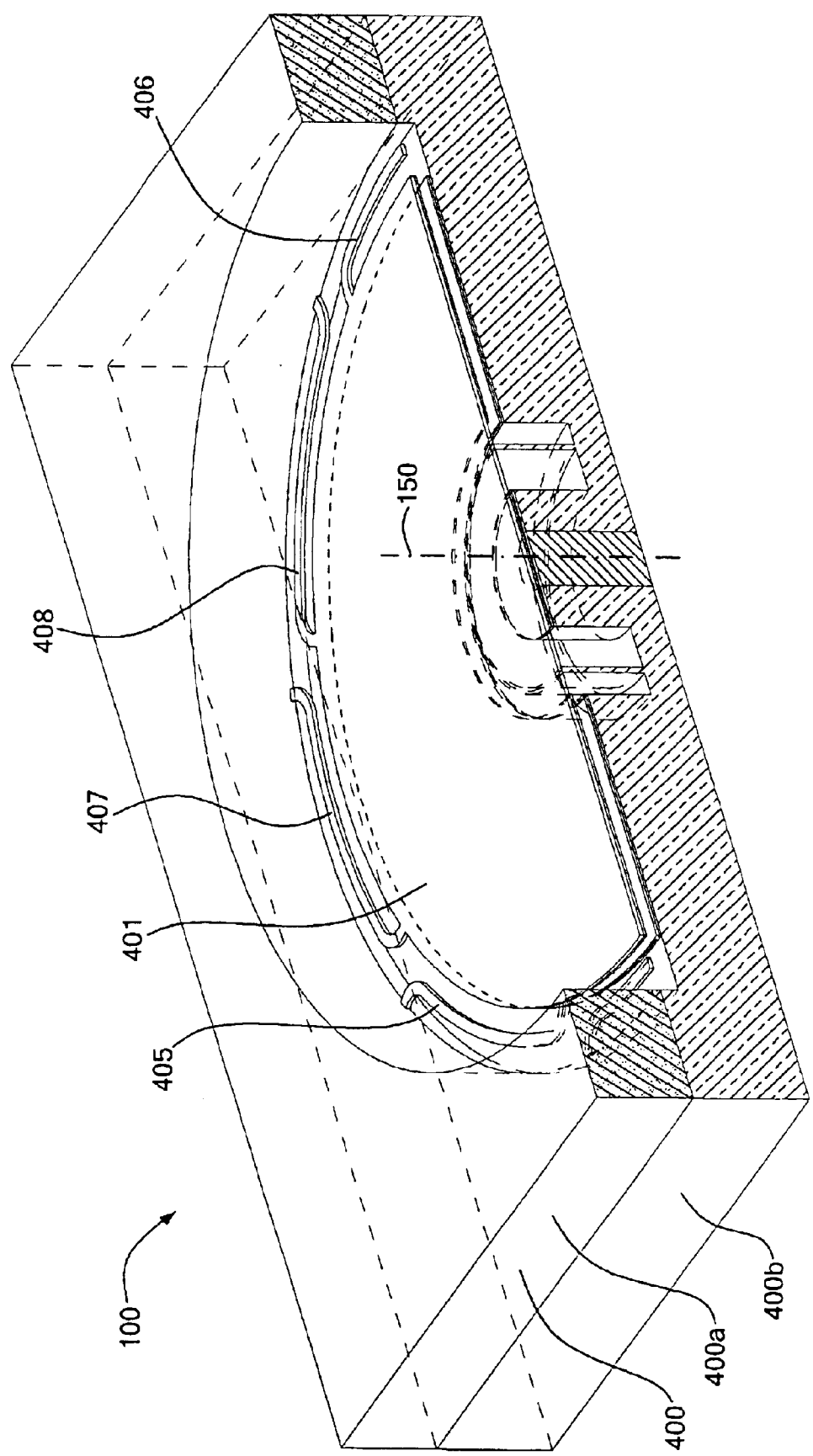
FIG. 5 is a cross-sectional view of the tank circuit of FIGS. 4 and 4A, including a flexure element.

The first structure 400a can be provided as a flexure element such as flexure element 400a shown in FIG. 5.

Referring briefly to FIG. 5, the first structure 400a is shown as a flexure element having a base 400, flexure arms 405–408, and a diaphragm 401. The diaphragm 401 may correspond for example to the first structure 52 of FIG. 2. With this arrangement, the diaphragm 401 is able to move relative to the base 400.

Referring again to FIGS. 4 and 4A, the circuit component 100 also includes a second structure 400b having a conductive layer 202, forming a second portion of the zipper actuator, an insulating layer 203, a support structure 402, a second conductive region 403a, and a fourth conductive region 403b. In one particular embodiment, the second and fourth conductive regions 403a, 403b respectively can be formed as a single conductive layer 403, or are otherwise coupled together. The second structure 400b can also include a conductive layer 302, electrically coupled to the conductive layer 301 at a bond 303a.

The first conductive region 101a can be the same as or similar to the first conductive region 84 of FIG. 3, the second conductive region 403a can be the same as or similar to the second conductive regions 90 of FIG. 3, the third conductive region 101b can be the same as or similar to the third conductive region 86 of FIG. 3, and the fourth conductive region 403b can be the same as or similar to the fourth conductive region 92 of FIG. 3.

The third conductive region 101b is coupled to the fourth conductive region 403b at a bond 303b. In one particular embodiment, the bond 303b is a thermocompression, or eutectic, bond, which is conductive.

A metal plugged via 105 provides an electrical connection to the second conductive region 403a. Electrical connections, (not shown) can couple the first conductive region 101a to one or more of the flexure arms 405, 406, which, in one particular embodiment, couple to an electrical ground through the base 400. The conductive layer 201 of the zipper actuator can also couple through one or more of the flexure arms 405, 406 to an electrical ground through the base 400. In one particular embodiment, the conductive layer 201 of the zipper actuator is coupled to different ones of the flexure arms 405, 406 than the first conductive region 403a, in order to provide isolation.

In one particular embodiment, the first structure 400a is made from silicon using integrated circuit processing techniques, for example, techniques shown in FIGS. 17–17E below, and the second structure 402b is made from quartz, made with quartz processing techniques also shown in FIGS. 17–17E below. In another embodiment, both the first and the second structures 400a, 400b are made from silicon. In another embodiment, the second structure 402b is made from glass, for example, PYREX® glass made by Corning®, Inc.

It will be recognized that a capacitor is formed by the first and second conductive regions 101a, 403a respectively. It will also be recognized that an inductor is formed by the third and fourth conductive regions 101b, 403b, when electrically joined together. The inductor and capacitor are electronically coupled in parallel to form an LC tank as described in conjunction with FIG. 3.

As shown below in FIG. 4B, in operation, the zipper actuator formed from the conductive layers 201, 202 allows the diaphragm 401 of the first structure 400a to contact the second structure 400b by electrostatic forces. As the electrostatic forces are increased further, the diaphragm of the first structure 400a and the second structure are 400b are drawn into more substantial contact, therefore bending the diaphragm 401 of the first structure 400a by increasing amounts. The zipper actuator can be made to operate under various ranges of voltage between the conductive layers 201, 202. In one particular embodiment, the voltage range is zero to twenty volts.

As can be clearly seen in FIG. 4A, the diaphragm 401 of the first structure 400a is deformed by applying a voltage between the conductive layer 201 and the conductive layer 202 of the zipper actuator, resulting in an attractive force between the conductive layer 201 and the conductive layer 202 having sufficient magnitude to cause part of the diaphragm 401 to be in contact with the lower structure 400b as shown, bending to essentially lay upon the second structure 400b as shown. The insulating layer 203 prevents electrical contact of the conductive layer 201 and the conductive layer 202 of the zipper actuator.

The force between the conductive layer 201 and the conductive layer 202 of the zipper actuator also results in elastic deformation of the support structure 402, and formation of a gap δ between the first conductive region 10a and the second conductive region 403a. In this way, the capacitor formed by the first conductive region 101a and the second conductive region 403a can be varied by application of a variable voltage between the conductive layer 201 and the conductive layer 202 of the zipper actuator. The variable gap δ provides tuning of the capacitance of the LC tank circuit, and therefore, variable movement of a resonant frequency of the LC tank circuit.

To achieve the zipper actuator, voltage is applied between the conductive layer 201 and the conductive layer 202, thereby causing them to attract and touch. Increasing the voltage applied will cause the diaphragm 401 to deform and "zip" together with the lower structure 400b, as shown. An insulating layer 203 is deposited to prevent a short circuit between the conductive layers 201, 202 during actuation. In the region close to where the diaphragm 401 having the conductive layer 201 contacts the insulating layer 203, there is a region of high electric field, which provides the force for increased "zipping" of the diaphragm 401 to the second structure 400b.

During "zipping", the support structure 402 also deforms outward as shown, which compels the center of the diaphragm 401 to bow upwards, increasing the gap δ, as indicated. The deflection of the diaphragm 401 is the mechanism by which the capacitance, and hence electrical resonant frequency, is tuned.

In an alternate embodiment, piezoelectric elements, for example, the piezoelectric elements 53a, 53b of FIGS. 2 and 2A can be used in place of, or in combination with, the zipper actuator comprised of conductive layers 201, 202 and insulator 203. However, the piezoelectric elements 53a, 53b when used alone do not result in the zipper actuation for which the diaphragm 401 of the first structure 400a essentially lays upon the second structure 400b as shown. The zipper actuator, for which the diaphragm 401 of the first structure 400a is in variable contact with the second structure 400b, provides a mechanism having enhanced control over the gap δ. The zipper actuator is described in greater detail in conjunction with FIG. 8.

Referring again to FIG. 5, it should be appreciated that in one embodiment, the diaphragm 401 can correspond to the first structure 52 of FIG. 2. With this arrangement, the diaphragm 401 is able to move relative to the base 400, enabling the diaphragm 401 to elastically deform as described above in conjunction with FIG. 4A Referring now to FIG. 6, a tunable LC tank circuit 500 includes a first structure 501 having a center point designated 507, a conductive region 504, and a conductive region 502. The tunable LC tank circuit 500 also includes a second structure 510 having a support structure 511, a conductive region 513, and a conductive region 508. The conductive regions 502, 504, 508, 513 in combination form a continuous conductor 512. The conductive regions 504, 513 form a variable capacitor having a capacitance related to the width of a variable gap δ, and the conductive regions 502, 508 form an inductor having an inductance that is essentially fixed as determined by the dimension d as well as the dimensions of conductors 502, 508.

The conductive regions 504, 513, each have a radius R1, and the conductive regions 504, 502 in combination have a radius R2. An oxide layer 505 can be disposed on the conductive region 513, having a fixed thickness $\delta_1$.

Electrical response characteristics of the circuit component 500 can be analyzed by first assuming that a current flows into the conductive region 504 and out the conductive region 513, by also assuming that the current distributes evenly, forming a surface current $K_f$ in the closed conductor 512, by also assuming that magnetic flux lines (not shown) are contained inside a toroid formed by the conductive regions 502, 508 respectively, and by assuming that an H field is zero directly outside of the closed conductor 512. A boundary condition, $n \times (H^a - H^b) = K_f$, is used, where $H^a$ is inside the toroid and $H^b$ is outside. Therefore, the H field inside the toroid is $H^a = K_f$.

The surface current $K_f$ is a function of the radius r is:

$$K_f = H = \frac{1}{2\pi r}.$$

The flux density is thus $$B = \mu_0 H = \frac{\mu_0 I}{2\pi r}.$$

To calculate inductance, the total flux in the toroid is calculated. This is done by integrating the flux density across a cross-sectional area of the toroid. Dividing the flux-linkage by the current gives the inductance, $$\phi = \lambda = \int_0^d \int_{R1}^{R2} \frac{\mu_0 I}{2\pi r} dr dz$$

$$L = \frac{\lambda}{I} = \frac{\mu_0 d}{2\pi} \ln \frac{R_2}{R_1}$$

Capacitance between the conductive regions 504, 513 respectively, derived by inspection, is written below, taking into account the effect of a higher permittivity, $\epsilon_1$, of the oxide layer 505 and the thickness $\delta_1$ of the oxide layer 505:

$$C(\delta) = \frac{\varepsilon_1 \delta_1 + \varepsilon_0 \delta}{(\delta_1 + \delta)^2} A.$$

The resistance of the toroid, i.e., effective resistance in series with the inductor formed by the conductive regions 502, 508 respectively, is calculated below. A skin depth $W_{Au}$ is a function of resonant frequency. The calculated resistance below does not take into account dielectric hysteresis, radiation, charge relaxation time constants, and leakage through first structure 501, all of which tend to reduce the Q of the LC tank circuit.

$$R = \frac{1}{2\pi \sigma_{Au} w_{Au}} \left( \frac{d}{R_1} + \frac{d}{R_2} + 2\ln \frac{R_2}{R_1} \right)$$

$$w_{Au} = \sqrt{\frac{2}{\omega \mu_0 \sigma}}$$

In one particular embodiment R1 is 200 μm, R2 is 300 μm, d is 400 μm, the thickness of the oxide layer 505 is 50 nm, the variable gap δ can be varied in a range between 0 nm and 340 nm, the closed conductor 512 is comprised of gold having a skin depth of 0.93 μm, a calculated inductance of the toroid formed by the conductive regions 502, 508, respectively is 73.3 pH, a calculated equivalent series resistance of the toroid is 10.1 mΩ, a capacitance of the capacitor formed by the conductive regions 504, 513, respectively, varies between 144.6 pF and 3.4 pF as the variable gap is varied in the above range, the resonant frequency varies between 1.5 GHz and 10.1 GHz as the variable gap is varied in the above range, and the Q varies between 71 and 133 as the variable gap is varied in the above range. However, in other embodiments, other dimensions and characteristics can be selected in order to provide a circuit component having another capacitance range, another inductance, another range of resonant frequencies, and another range of Qs.

Figure 7:
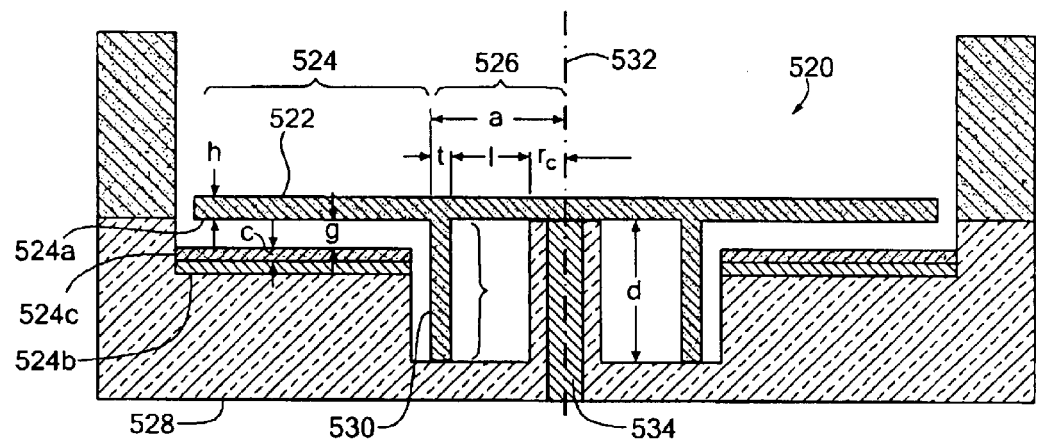
FIG. 7 is a cross-sectional view of yet another exemplary circuit component, shown in a relaxed state, which can be used to form a variable capacitor and/or a variable tank circuit.

Referring now to FIG. 7, another embodiment of a circuit component 520 includes an upper or first structure 522 having a support structure 530 and a center plate region 526. The circuit component 520 also includes a second structure 528 having a conductive via 532. A zipper actuator 524 includes a conductive layer 524a on the first structure 522, a conductive layer 524b on the second structure 528, and an insulator layer 524c also on the second structure 528. Various other conductive and insulator layers shown in figures above are omitted from FIG. 7 to avoid unnecessary complexity, since FIG. 7 is used to provide dimensions for mathematical computations below.

The zipper actuator 524 has an actuation gap g, an insulator thickness c, and a first structure thickness h. The support structure 530 has a thickness t. The first structure 522 also has a capacitor region radius $r_c$, and an inductor width l. The second structure 530 has a dimension "a" as shown.

Comparing the circuit component of FIG. 7 with the circuit component 50 of FIG. 2, it can be seen that the support structure 530 is formed as part of the first structure 522, unlike FIG. 2, where the support structure 56 is formed as part of the second structure 62.

In one particular embodiment, $r_c$=200 μm, l=300 μm, t=25 μm, a=525 μm, h=10 μm, g=10 μm, and c=0.2 μm. However, in other embodiments, other dimension can be used.

Figure 8:
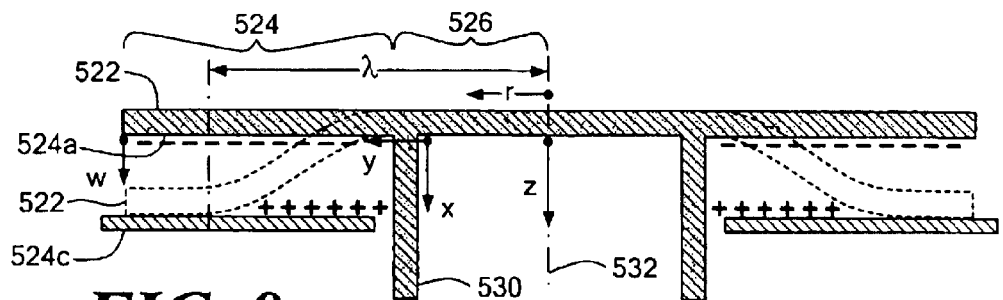
FIG. 8 is a cross-sectional view of a portion of the exemplary circuit component of FIG. 7.

Referring now to FIG. 8, in which like elements of FIG. 7 are shown having like reference designations, the first structure 522 is shown in a relaxed state, and the first structure, designated 522', is shown when the zipper actuator is energized. Electrical charges +, − indicate a voltage applied to the zipper actuator 524. Axes r and z form a first coordinate system used below. Axes x and y form a second coordinate system also used below.

A differential equation that governs the zipper actuator 524 can be written as:

$$\frac{d^4w}{dr^4} + \frac{2}{r}\frac{d^3w}{dr^3} - \frac{1}{r^2}\frac{d^2w}{dr^2} + \frac{1}{r^3}\frac{dw}{dr} = \frac{\varepsilon V^2}{2D}\frac{1}{(g-w+c/\varepsilon)^2}$$

where $\epsilon = 8.85 \times 10^{-12} C^2/N \cdot n$: Permittivity of air;

$V \leq 20V$: Voltage applied across the zipper actuator;

$$D = \frac{Eh^3}{12(1-v^2)}$$

Flexural rigidity of the plate;

E=166 GPa: Young's modulus of silicon, taken to be a nominal value (isotropic) for simplification;

v=0.25: Poisson ratio of silicon;

We define λ to be the radial position of the point where the top plate pins down on the bottom electrode. Introducing two normalized variables $$W = \frac{r}{g}$$

$$R = \frac{r-a}{\lambda-a},$$

the normalized equation becomes $$\frac{d^4W}{dR^4} + \frac{2}{R+A}\frac{d^3W}{dR^3} - \frac{1}{(R+A)^2}\frac{d^2W}{dR^2} + \frac{1}{(R+A)^3}\frac{dW}{dR} = \frac{\beta}{\left(1-W+\frac{c/\varepsilon}{g}\right)^2}, \text{ where, } A = \frac{\alpha}{\lambda-a}, \text{ and } \beta = \frac{(\lambda-a)^4 \varepsilon V^2}{2Dg^3}$$

are both dimensionless numbers.

The boundary conditions are:

$W(0) = \delta = 0$ $W'(0) = \phi$ $W(1) = 1$ $W'(1) = 0$ $W''(1) = 0$

The vertical deflection of the support structure 530 is assumed to be zero. Further calculations reveal that since the deflection is very small, it does not have a significant effect on the end results. The normalized equation above can be solved by estimating φ. The value of β will also be obtained, from which voltage V can be derived. Knowing the voltage and the deflection of the plate, the total force and moment acting at the fulcrum end can be found to be:

$$F = \int_o^\lambda \frac{1}{2}\frac{\varepsilon V^2}{(g-w+c/\varepsilon)^2} \cdot 2\pi r \cdot dr$$

$$M = \int_o^\lambda \frac{1}{2}\frac{\varepsilon V^2}{(g-w+c/\varepsilon)^1} \cdot 2\pi r \cdot (r-a) dr$$

Rotation φ of the center plate region 526 at the support structure 530 is analyzed by analyzing the center plate region 526 and the support structure 530.

The support structure 530 can be modeled as a long cylindrical shell, which is governed by the following differential equation:

$$D\frac{d^4y}{dx^4} + \frac{Eh}{a^2}y = 0, \text{ or, } \frac{d^4y}{dx^4} + 4\alpha y = 0, \text{ where } \alpha = \frac{Eh}{4a^2D},$$

The boundary conditions are:

$$D\frac{d^2y}{dx^2} = M_2$$

$$D\frac{d^3y}{dx^3} = 0.$$

The solution can be found to be, $$y = \frac{e^{-\alpha x}M_2}{2\alpha^2 D}(\sin\alpha x - \cos\alpha x), \text{ and hence, } y(0) = \frac{M_2}{\alpha D} = \phi.$$

Since a value for φ was estimated from the zipper actuator analysis above, $M_2$ can be found. We then check the validity of $M_2$ by modeling the center plate.

The center plate region 526 is subjected to a uniform force and moment applied to its outer edge. The governing equation can be written as:

$$\frac{d}{dr}\left[\frac{1}{r}\frac{d}{dr}\left(r\frac{dz}{dr}\right)\right]=0$$

with boundary conditions:

$\dot{z}(0)=0$ $z(a)=\delta=0$ $\dot{z}(a)=\phi$ $D\cdot\ddot{z}(a)=M_3$ where $M_3=M-M_2$.

The solution is found to be, $$z=\frac{C_1}{4}r^2+C_2\ln r+C_3, \text{ where } C_1=\frac{2}{D}M_3 \quad C_2=0 \quad C_3=-\frac{M_3 a^2}{2D}$$

Finally we can check the value of $\phi$ by differentiating z, $$\dot{z}(a)=\frac{C_1}{2}a$$

After some iteration, this should return the same value as the $\phi$ estimated at the beginning in order for the solutions to converge.

Figure 10:
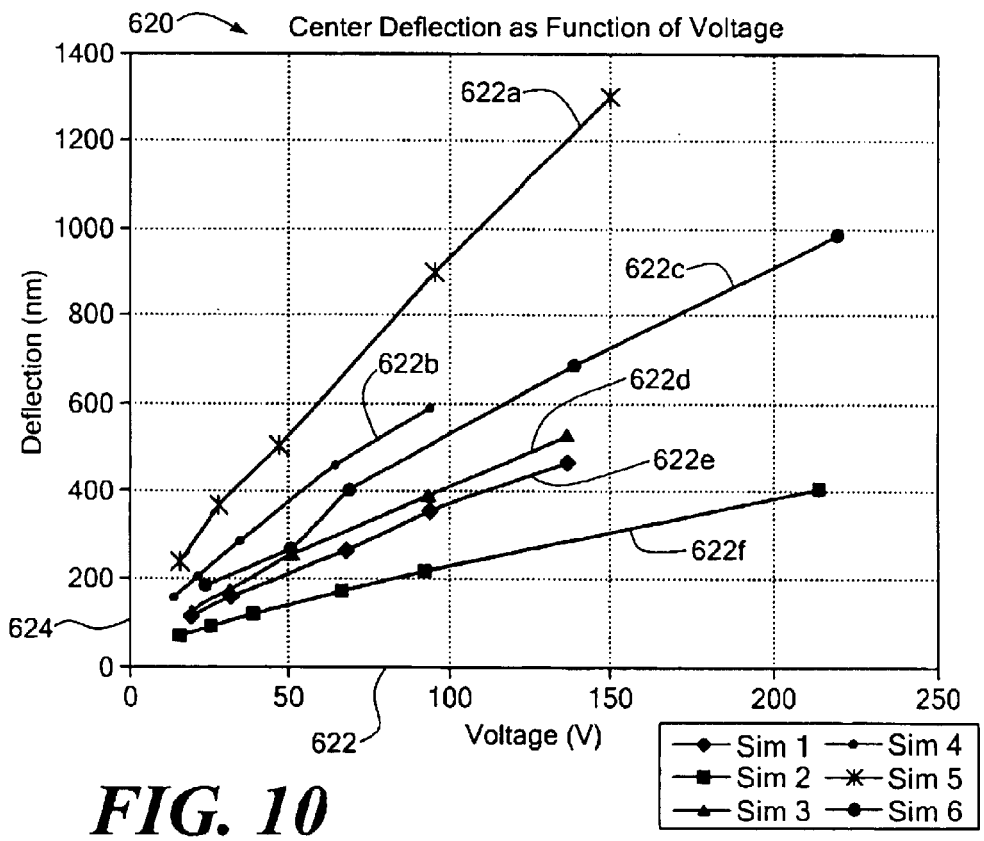
FIG. 10 is a graph showing a relationship between deflection and voltage for the exemplary circuit component of FIGS. 7 and 8.
Figure 11:
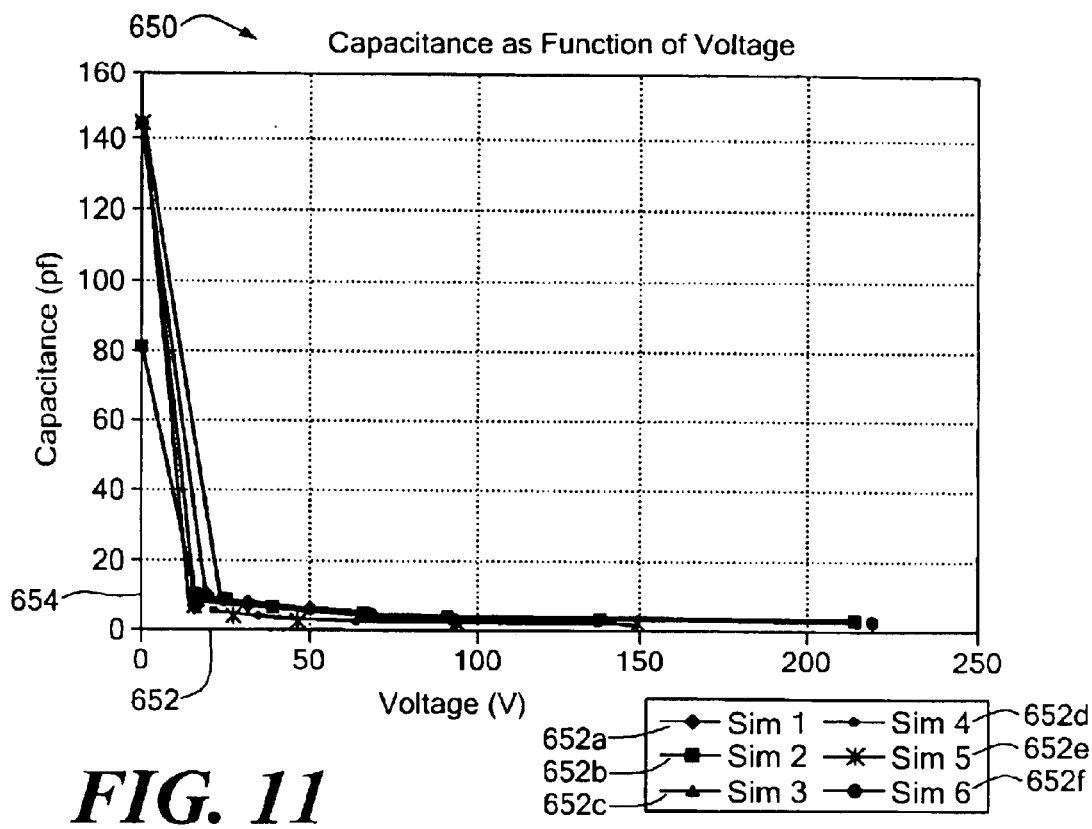
FIG. 11 is a graph showing a relationship between capacitance and voltage for the exemplary circuit component of FIGS. 7 and 8.
Figure 12:
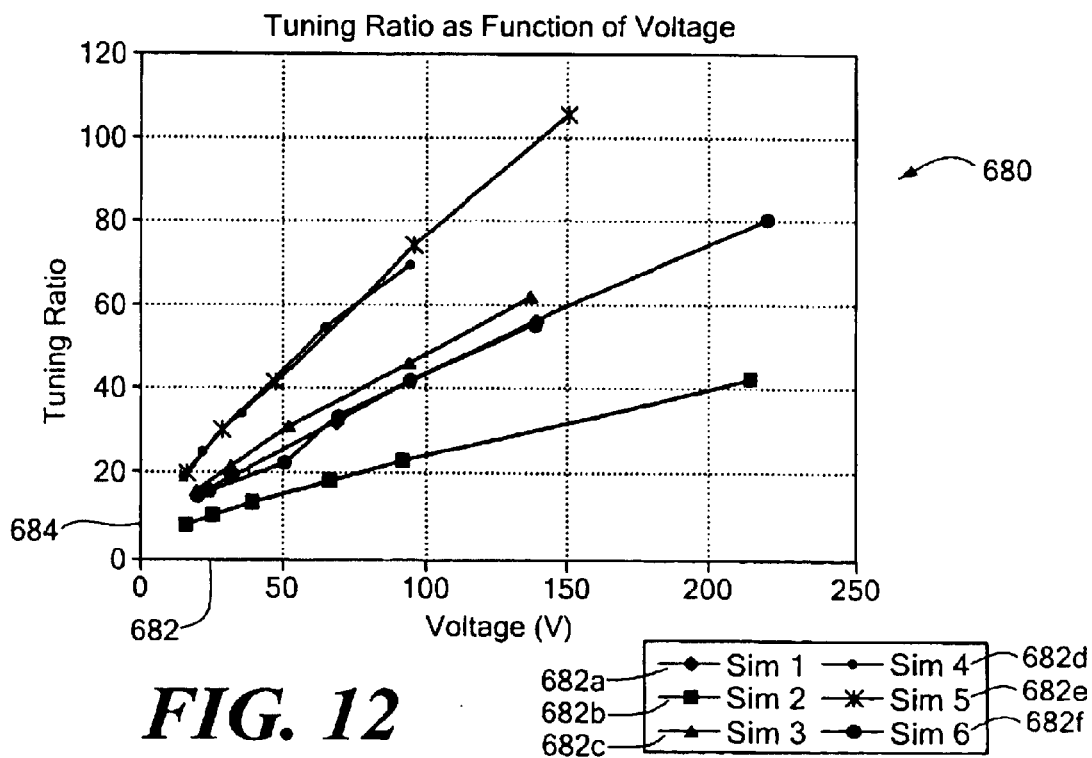
FIG. 12 is a graph showing a relationship between tuning ratio and voltage for the exemplary circuit component of FIGS. 7 and 8.

A simulation matrix is shown in Table 1, having values associated with curves shown in FIGS. 10–12. As seen in Table 1, in all of the simulations, the thickness h of the upper structure 522 and the actuation gap g are fixed. The variables include a support structure radius a ($a=r_c+L+t$) of the support structure 530, the thickness t of the support structure 530, the diameter $r_c$ of the capacitor, and the thickness of the capacitor dielectric (not shown), which can be the same as the thickness c of the zipper actuator insulator 524c.

TABLE 1

Parameter matrix for six different simulations.

| | | Sim 1 | Sim 2 | Sim 3 | Sim 4 | Sim 5 | Sim 6 |
|---|---|---|---|---|---|---|---|
| Upper Structure Thickness | h (µm) | 17 | 17 | 17 | 17 | 17 | 17 |
| Actuation Gap | g (µm) | 10 | 10 | 10 | 10 | 10 | 10 |
| Support Structure Thickness | t (µm) | 25 | 25 | 15 | 25 | 25 | 25 |
| Support Structure Radius | a (µm) | 500 | 400 | 400 | 500 | 600 | 600 |
| Capacitor Dielectric | c (µm) | 0.2 | 0.2 | 0.2 | 0.1 | 0.1 | 0.2 |
| Capacitor Diameter | $r_c$ (µm) | 400 | 300 | 400 | 400 | 400 | 400 |

The zipper actuator 524 can be designed to move by a relatively large amount to provide contact between the first structure 522 and the conductive layer 524c compared to a relatively small movement of the first structure 522 near the central axis 532. This relationship can provide a mechanical advantage which can be in the range of about 10:1 to 100:1.

Figure 9:
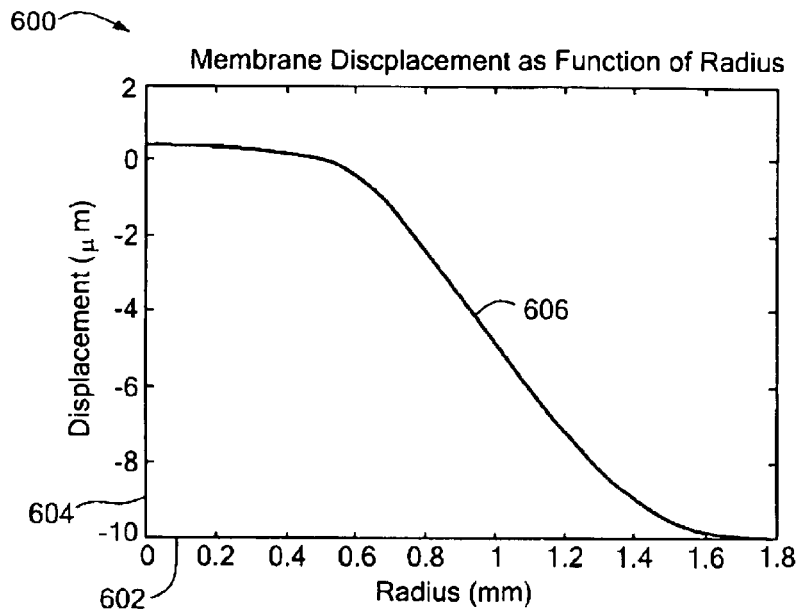
FIG. 9 is a graph showing a relationship between displacement and radius for the exemplary circuit component of FIGS. 7 and 8.

Referring now to FIG. 9, a graph 600 of displacement (in microns) vs. radius (in millimeters) includes an x-axis 602 corresponding to distance from a center (e.g., center 532 in FIG. 8) along a first structure (e.g., structure 522 in FIG. 8), and a y-axis 604 corresponding to displacement which represents a movement between a first structure (e.g., structure 522 in FIG. 7) relative to a second structure (e.g., structure 528 in FIG. 7). The data in FIG. 9 is computed assuming that the first and second structures have circular symmetry (e.g., circular symmetry about axis 532 in FIG. 7).

Thus, curve 606 corresponds to displacement of the first structure 522 at radial positions of the structure 522 where a radius of zero corresponds to a center of one of the structures (e.g., center 532 in FIG. 8).

For the embodiment having dimensions as described in conjunction with FIG. 7, the curve 606 shows that the displacement at the center 532 is upward by approximately 340 nm at maximum elastic deformation of the first structure 522, i.e., when the zipper actuator 524 (FIG. 8) is fully energized. The deflection of the first structure 522 increases to −10 µm at its outer edge.

Referring now to FIG. 10, curves 622a–622f represent deflection vs. voltage of plates of a capacitor (e.g., capacitor plates 20 and 26 described above in conjunction with FIG. 1A). X-axis 622 corresponds to voltage level (in units of volts) applied to the zipper actuator 524 (FIG. 8), and y-axis 604 corresponds to deflection (in units of nanometers).

Curves 622a–622f show simulation results for simulations 1 through 6 listed in Table 1 above. It can be concluded that a larger diameter support structure 530 (FIG. 8) results in more deflection of the center plate region 526 (FIG. 8). Also, a thinner thickness c (FIG. 7) of the dielectric of the zipper actuator results in zipper actuator movement at lower voltages.

Furthermore, a thinner support structure 530 (FIG. 8) results in more deflection of the center plate region 526.

Referring now to FIG. 11, curves 652a–652f represent capacitance value vs. voltage for a capacitor of the type described above in conjunction with FIGS. 7 and 8. X-axis 652 corresponds to voltage level (in units of volts) applied to the zipper actuator 524 (FIG. 8), and y-axis 654 corresponds to capacitance (in units of picoFarads).

Curves 652a–652f show simulation results for simulations 1 through 6 as shown listed in Table 1 above. The curves show the initial capacitance when voltage applied to the zipper actuator 524 (FIG. 8) is at 0V, and the capacitances after the actuator is fully actuated. The curves do not show any capacitances in between 0V and full actuation. The capacitance values shown correspond to the deflections of the center plate, and they demonstrate the change in capacitance when the zipper actuator is actuated at different voltages.

Referring now to FIG. 12, curves 682a–682f represent tuning ratio (unitless) vs. voltage (in units of volts) for a capacitor of the type described above in conjunction with FIGS. 7 and 8. X-axis 682 corresponds to voltage (in units of volts) applied to the zipper actuator 524 (FIG. 8) and y-axis 684 corresponds to tuning ratio. Tuning ratio is defined as $C_f - C_i/C_i$, where $C_f$ is the final capacitance, and $C_i$ is the initial capacitance. In the calculation, $C_i$ is a fixed value, and $C_f$ changes with voltage as demonstrated in FIG. 11. Therefore, the tuning ratio is a function of the maximum voltage applied to the zipper actuator.

Curves 682a–682f show simulation results for simulations 1 though 6 as shown listed in Table 1 above. The curves demonstrate the tuning ratios of each simulation at different actuation voltages and for different geometries (see table 1). By varying the capacitor geometry, and the maximum actuation voltage, tuning ratios on the order of 10–100 can be obtained.

Figure 13:
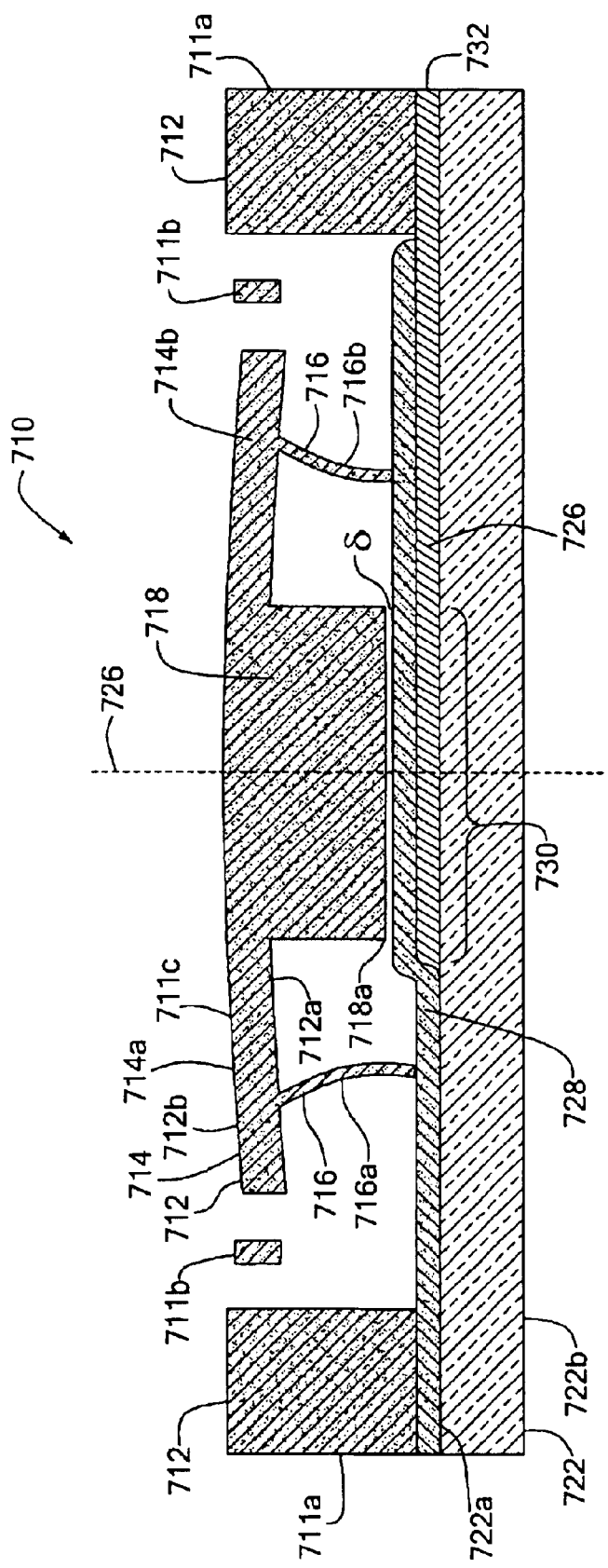
FIG. 13 is a cross-sectional view of yet another exemplary capacitor, shown in an elastically deformed state.

Referring now to FIG. 13, an exemplary circuit component 710, forming a variable capacitor, includes a first (or upper) structure 712, provided from an elastically deformable material, having a first surface 712a and a second surface 712b. The first structure 712 has lever regions 714a, 714b, collectively 714, and a central region 718, which, in this particular embodiment, is shown to be thicker than the lever regions 714.

A surface 718a of the central region 718 forms a first capacitor plate. An electrical contact to the surface 718a of the central region 718 can be formed by heavily doping the first structure 712 to make the first structure conductive. The first structure 712 can be part of a flexure element, having a base 711a, flexure arms 711b, and a diaphragm 711c, similar to the flexure element shown in FIG. 5.

The exemplary circuit component 710 also includes a second (or lower) structure 722, having a first surface 722a and a second surface 722b. The first surface 722a of the second structure 722 can have a conductor 726 disposed thereon. The conductor 726 forms a second capacitor plate, which in combination with the capacitor plate formed by the surface 718a of the first structure, forms a capacitor in a capacitor region 730. The conductor 726 also provides an electrical contact path 732. An insulator 728 can be disposed on the conductor 726.

Support structures 716a, 716b couple the first structure 712 to the second structure 722. The support structures 716a, 716b act as fulcrums about which the first structure 712 can be elastically deformed in response to a force, causing at least the portion of the first surface 712a of the first structure 712 to move relative to the first surface 722a of the second structure 722 along an axis 726. In this way, the circuit component 710 acts as a variable capacitor.

Piezoelectric elements (not shown), similar to the piezoelectric elements 13 of FIG. 1, can be coupled to the second surface 712b of the first structure 712 in order to provide a force upon the first structure 712 in the lever regions 714a, 714b in order to generate a gap $\delta$ in much the same way as described in conjunction with FIG. 1A. In other embodiments, a zipper actuator can be provided in place of, or in addition to, the piezoelectric elements to provide a force upon the second surface 712b. An exemplary zipper actuator is described above in conjunction with FIGS, 4, 4A, and 8.

In one particular embodiment, the circuit component 710 is circularly symmetric about the axis 726, and is therefore essentially round. With this arrangement, the lever regions 714a, 714a can be but one lever region 714, and the support structures 716a, 716b can be but one support structure 716.

In one particular embodiment, the first structure 712 is made from silicon using integrated circuit processing techniques, for example, techniques shown in FIGS. 16–16E below, and the second structure 722 is made from quartz, using quartz processing techniques also shown in FIGS. 16–16E below. In another embodiment, both the first and the second structures 712, 722 are made from silicon. In another embodiment, the second structure 722 is made from glass, for example, PYREX® glass, made by Corning®, Inc.

In one particular embodiment, the support structure 716 is an integral part of the first structure 712. Where the second structure 722 is glass or quartz as described above, the support structure 716 can be coupled to the second structure 722 with anodic bonding techniques or thermocompression techniques. Where the second structure 722 is silicon, also as described above, the support structure 716 can be coupled to the second structure 722 with fusion bonding techniques. In another embodiment, the support structure 716 is an integral part of the second structure 722. In one particular arrangement, the capacitor region 730 has a 1.5 mm diameter, and the diameter of the first structure 712 can be in the range of 6–12 mm, however, other dimensions can also be used.

Figure 14:
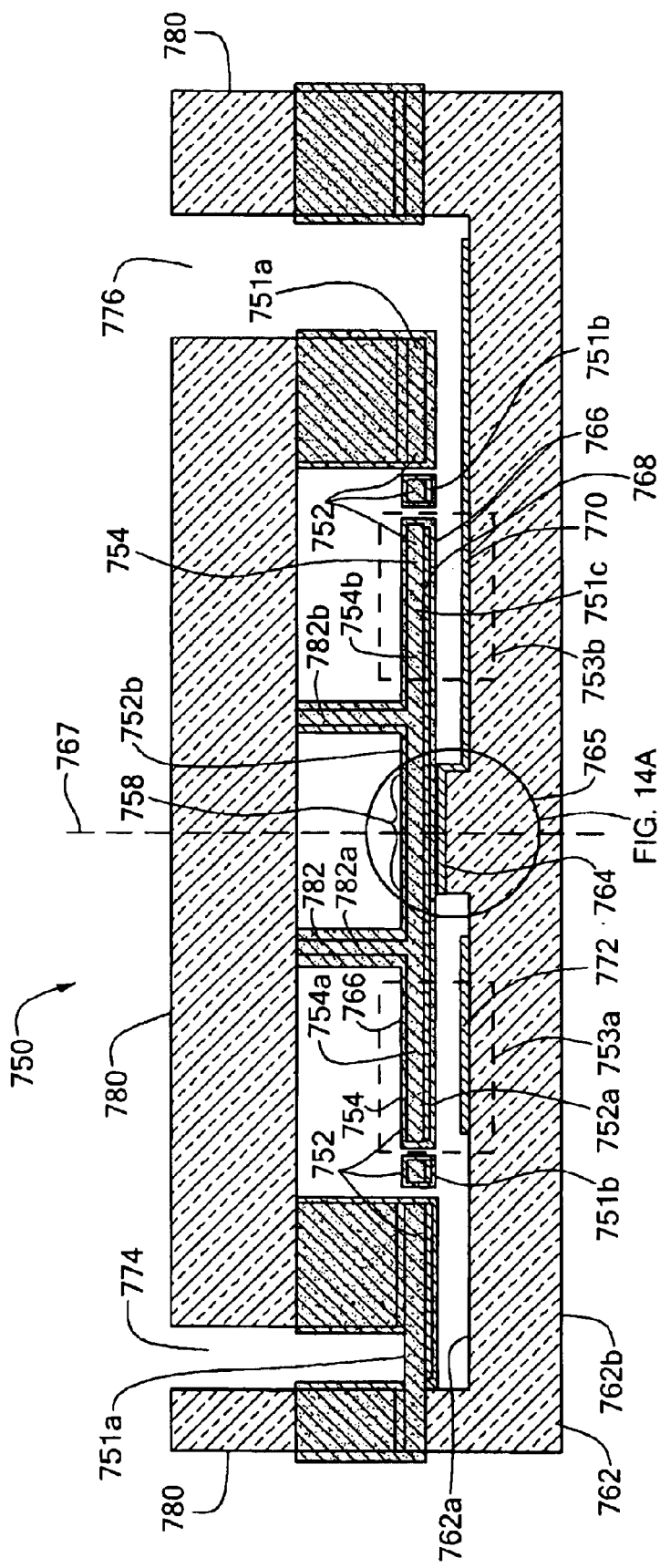
FIG. 14 is a cross-sectional view of yet another exemplary capacitor, shown in a relaxed state.
Figure 14A:
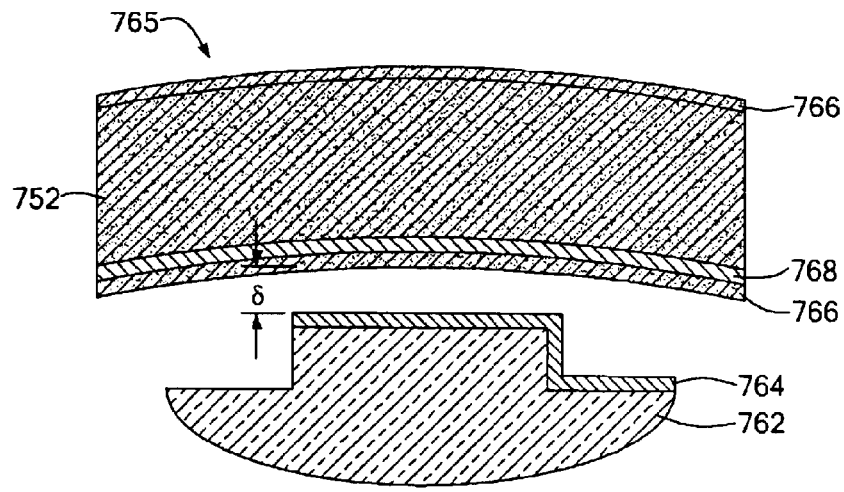
FIG. 14A is a cross-sectional view of a portion of the exemplary capacitor of FIG. 14, shown in an elastically deformed state.

Referring now to FIGS. 14 and 14A in which like elements are provided having like reference designations, a variable capacitor 750 includes a first structure 752, having first and second opposing surfaces 752a, 752b, lever regions 754a, 754b (collectively designated 754), and a central region 758. The first structure 752 is provided from an elastically deformable material, for example, silicon. A conductive layer 768 disposed on the central region 758 forms a first capacitor plate.

A zipper actuator is formed by disposing a conductive layer over a movable section of the first structure 752 and a conductive layer over a stationary section of the second structure 762 having an insulating material disposed therebetween. In the exemplary embodiment shown in FIG. 14, a first zipper actuator 753a is provided from the conductive material 768 disposed over a region 754a of the structure 752, insulating material 766 disposed over the conductive material 768 in the region 754a, and a conductive material 772 disposed over the surface 762a of the second structure 762. Thus, the zipper actuator 753a is provided from region 754a, having the conductor 768, the insulator 766, and the conductor 772.

Similarly, zipper actuator 753b is provided from region 754b of the first structure, having the conductor 768, the insulator 766, and the conductor 770. The zipper actuators 753a, 753b can be electrically isolated from the conductive layer 768 of the central region 758. The first structure 752 can be part of a flexure element, having a base 751a, flexure arms 751b, and a diaphragm 751c, similar to the flexure element shown in FIG. 5.

The second structure 762 is provided having first and second opposing surfaces 762a, 762b and conductive layer 764 disposed on the first surface 762a. The conductive layer 764 forms a second capacitor plate, which, in combination with the capacitor plate formed by the conductive layer 768 on the central region 758, forms a capacitor in a capacitor region 765.

The exemplary circuit component 750 also includes a third structure 780. Support structures 782a, 782b couple the third structure 780 to the first structure 752. The support structures 782a, 782b act as fulcrums about which the first structure 752 can be elastically deformed in response to a force, causing at least the portion of the first surface 752a of the first structure 752 to move relative to the first surface 762a of the second structure 762 along an axis 767. In this way, the circuit component 750 acts as a variable capacitor.

Vias 774, 776 provide electrical connection to the conductive layers 768, 770, 772 described above. The vias 774, 776 can either be open, plated (not shown), or plugged (not shown).

In operation, when the zipper actuator formed by the conductive layers 768, 770, and 772 is energized, pulling the first structure 752 toward the second structure 762, the first structure 752, rigidly attached to the third structure 780, tends to bow in the capacitor region 765 away from the second structure 762. The bowing is more clearly seen in FIG. 14A. Thus, when the zipper actuator formed by the conductive layers 768, 770, and 772 (FIG. 14) is energized, pulling the first structure 752 toward the second structure 762, the first structure 752, tends to bow in the capacitor region 765 away from the second structure 762, forming a gap $\delta$, effecting the capacitance of the capacitor region 765.

In one particular embodiment, the circuit component 750 is circularly symmetric about the axis 767, and is therefore essentially round. With this arrangement, the support structures 782a, 782b can be but one support structure 782.

In one particular embodiment, the first structure 752 is made from silicon using integrated circuit processing techniques, for example, techniques shown in FIGS. 16–16E below, and the second and third structures 762, 780 are made from glass, for example, PYREX® glass made by Corning®, Inc, made with glass processing techniques also shown in FIGS. 16–16E below. In another embodiment, both the first and the second structures 752, 762 are made from silicon. In another embodiment, the second and third structures 762, 780 are made from quartz.

In one particular embodiment, the support structure 782 is an integral part of the first structure 752. Where the third structure 780 is glass or quartz as described above, the support structure 782 can be coupled to the third structure 780 with anodic bonding techniques or thermocompression techniques. Where the third structure 780 is silicon, also as described above, the support structure 782 can be coupled to the third structure 780 with fusion bonding techniques.

Figure 15:
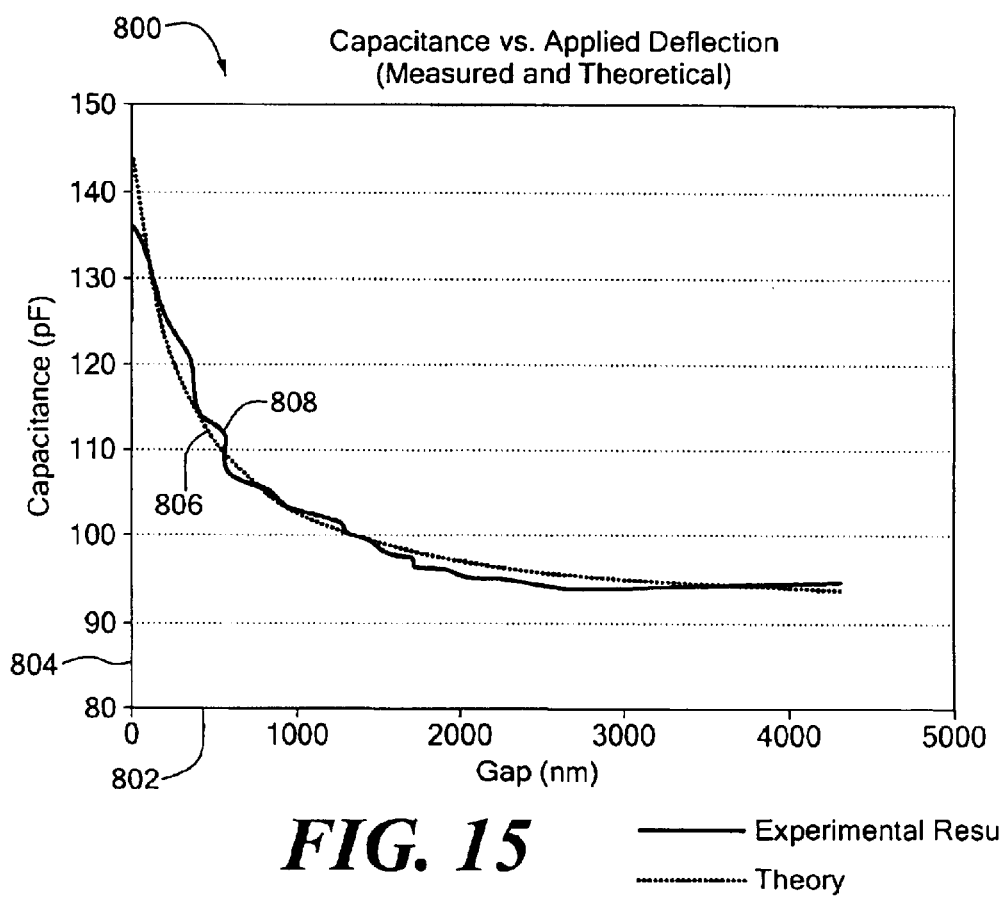
FIG. 15 is a graph showing a relationship between capacitance and gap for the exemplary embodiment of FIG. 13.

Referring now to FIG. 15, curves 806, 808 represent capacitance vs. gap spacing for a capacitor 710 of the type described above in conjunction with FIG. 13. An x-axis 802 corresponds to a gap (e.g., the gap width δ in FIG. 13), and a y-axis 804 corresponds to the resulting capacitance of a circuit, component (e.g., circuit component 710, FIG. 13). The curve 806 corresponds to predicted results and the curve 808 corresponds to measured results. The curves include the effect of experimental parasitic capacitance, approximately 90 pF.

The graph 800 shows also that a tuning ratio for the circuit component 710 (FIG. 13) is 13.3, defined as the ratio of the maximum capacitance to the minimum capacitance (subtracting experimental parasitic capacitance=90 pF). The measured data for initial and final capacitance are 49.3 pF and 3.7 pF, giving a tuning ratio of 13.3.

Figure 16:
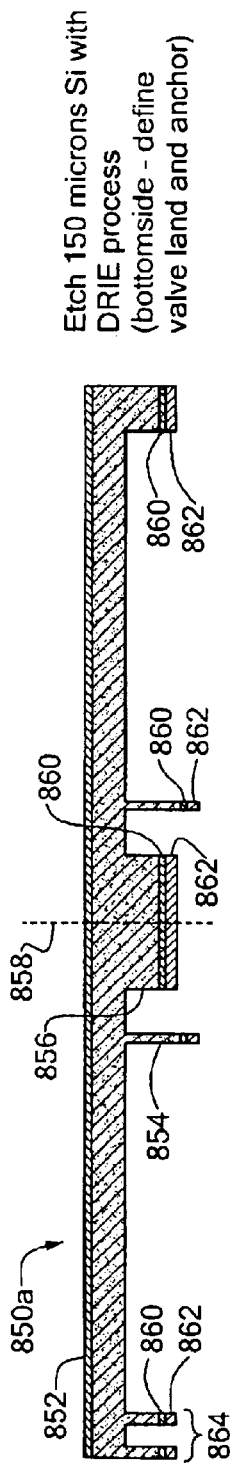
FIGS. 16–16E are a series of cross-sectional views showing steps performed to fabricate the circuit component of FIG. 13.
Figure 16A:
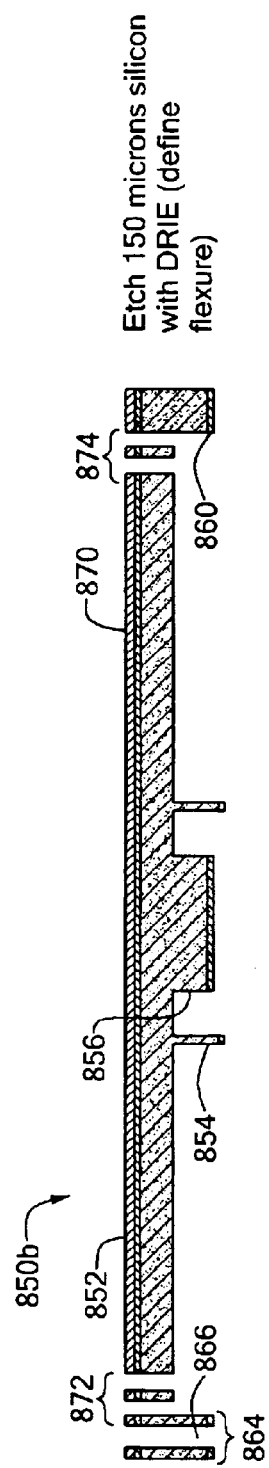
Figure 16B:
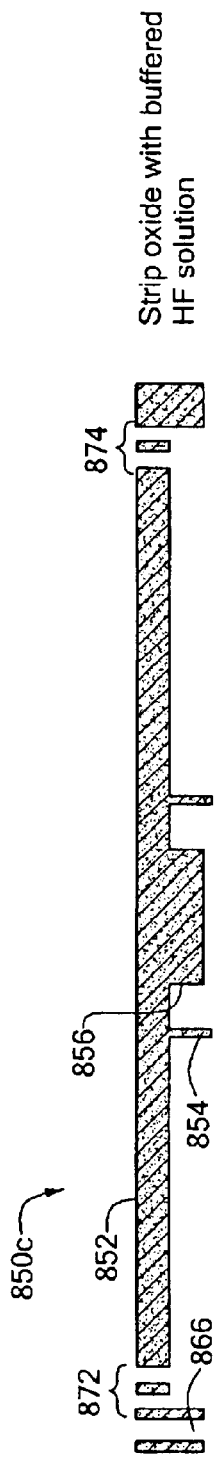

Referring now to FIGS. 16–16E in which like elements are provided having like reference designations, a process 850a–850f can be used to form the structures described above, including, but not limited to, the circuit component 10 of FIGS. 1 and 1A, the circuit component 80 of FIG. 3, the circuit component 520 of FIG. 7, and the circuit component 700 of FIG. 13.

In a process step 850a, a wafer 852, which in one embodiment is a silicon wafer, is etched, for example, with Bosch® deep reactive ion etching (DRIE), to form a shape as shown, having a support structure 854, and a central region 856, where it will be understood that the shape is circularly symmetric about an axis 858. A resist layer 862 is placed on the wafer and patterned by first exposing with UV light and then dissolving exposed regions in developer. The underlying oxide layer 860 is subsequently etched in buffered oxide etch, a buffered aqueous solution of concentrated 49% hydrofluoric acid (HF) and ammonium fluoride (NH$_4$F) in appropriate proportions (typically 7:1). These masking layers are resistant to the etching gases present in the DRIE process and direct the etching to certain areas of the wafer 852. An interconnecting via region 864 is also formed by the DRIE process. In one particular embodiment, a minimum resulting thickness of the wafer 852 is on the order of 10 μm.

In a process step 850b, a resist layer 870 is applied to a surface of the wafer as shown, and regions 872 and 874 are formed by the DRIE process (as in 850a), and correspond to flexure arms which can be the same as or similar to the flexure arm 405–408 of FIG. 5. Also at 30 this step, the interconnecting via region 864 is further formed to be a through hole via 866.

In a process step 850c the remaining oxide layer 860 of the process step 850b is stripped off with a dilute hydrofluoric acid (HF) solution.

In a process step 850d, a conductive layer 880, for example, a chromium (Cr) layer 880 is deposited, for example with an electron beam process, onto the central region 856 as shown. Onto the Cr layer 880, a platinum (Pt) layer 882 is deposited. In one particular embodiment, the Cr layer 880 is approximately ten nanometers think and the Pt layer 882 is approximately two hundred nanometers thick.

In a process step 850e, a substrate 890, for example, a PYREX® glass substrate made by Corning®, Inc, is processed. An aluminum (Al) layer 892 is deposited of a surface of the glass substrate 890 as shown. Onto the Al layer 892, an insulating layer 894, for example an oxide layer, is deposited. In one particular embodiment, the Al layer 892 is approximately one hundred nanometers thick and the insulating layer 894 is approximately one hundred nanometers thick.

In a process step 850f, the wafer 852 is bonded to the substrate 890, and in particular, the support structure 854 is bonded to the substrate at a joint 900. In one particular embodiment, the joint 900 is formed by anodic bonding. It will be appreciated the joint 900 formed as an anodic bond can be selectively formed such that only desired regions are bonded as shown. Bonding can be prevented in undesired regions by application of a metal film to the undesired regions, for example the Cr/Pt layers 880, 882 described above. It is those layers 880, 882, which prevent bonding of the central region 856 to the second structure 890.

While the processes above show the substrate 852 to be a glass substrate, in other embodiments, the substrate 852 can be a quartz substrate or a silicon substrate.

Referring now to FIGS. 17–17E in which like elements are provided having like reference designations, a process 950a–950f can be used to form the structures described above, including, but not limited to, the circuit component 50 of FIGS. 2 and 2A, the circuit component 100 of FIGS. 4 and 4A, the circuit component 100 of FIG. 5, the circuit component 500 of FIG. 6, and the circuit component 520 of FIG. 7.

In a process step 950a, a substrate 952, which in one embodiment is quartz substrate, is drilled, for example ultrasonically drilled, to form a second structure 952 having a via 954. The substrate 952 is backfilled with a conductor, for example gold, to form a gold plugged via 954. The substrate 952 can be polished to form smooth surfaces.

In a process step 950b, the substrate 952 is etched, for example wet etched, to form a cavity 958. A metal electrode layer 960 is deposited into the cavity 958 and an insulator, for the same way as described in conjunction with FIG. 1A. In other embodiments, a zipper metal electrode layer 960 is used to form a portion of a zipper actuator, for example the zipper actuator region 524 of FIG. 8.

In a process step 950c, the substrate is etched, for example with reactive ion etching (RIE) advanced oxide etch (AOE), to provide a support structure 964 and a central region 966. In one particular embodiment, the support structure 964 and the central region 966 are each approximately 100 microns deep.

In a process step 950d a metal layer 968, for example a gold layer, is deposited, for example with an electroless process, onto surfaces of the substrate 952 as shown. It will be recognized that portions of the metal layer 968 form a portion of a capacitor and other portions form an inductor as seen in FIGS. 4 and 4A.

In a process step 950e, a wafer 980, for example a silicon wafer, is etched to provide a first structure as a flexure element having a base 980a, flexure arms 980b, and a diaphragm 980c. The flexure element 980 is described above in conjunction with FIG. 5. A trench is etched and backfilled with an insulator, for example an oxide, to provide an insulating layer 982. A metal layer 984, for example a gold layer, is applied to portions of the wafer 980 as shown. An insulating layer 986, for example an oxide, is deposited on the metal layer 984. It will be appreciated that portions of the metal layer 984 provide a capacitor plate, and other portions provide zipper actuator plates.

In a process step 950f, the first structure 982 is bonded to the second structure 952, and in particular, the conductive layer 968 on the support structure 964 is bonded to the metal layer 984 of the first structure 982 at a bond 990. In one particular embodiment, the bond 990 is formed by a thermocompression process. In another embodiment, the bond is formed by an anodic (field-assisted) process. It will be appreciated the bond 990, if formed as a thermocompression bond, can be selectively formed such that only desired regions are bonded as shown. Bonding can be prevented in undesired regions by application of an oxide film to the undesired regions, for example the oxide layer 986 described above. It is the oxide layer 986 which prevents bonding of the center of the conductive layer 984 to the second structure 890, allowing bonding only at the edges of the conductive layer 984 as shown. It will also be appreciated that the bond 990, if formed as a fusion bond, can be selectively formed by roughening a surface in an undesired region.

While the processes above show the substrate 952 to be a quartz substrate, in other embodiment, the substrate can be a glass substrate or a silicon substrate.

Figure 18:
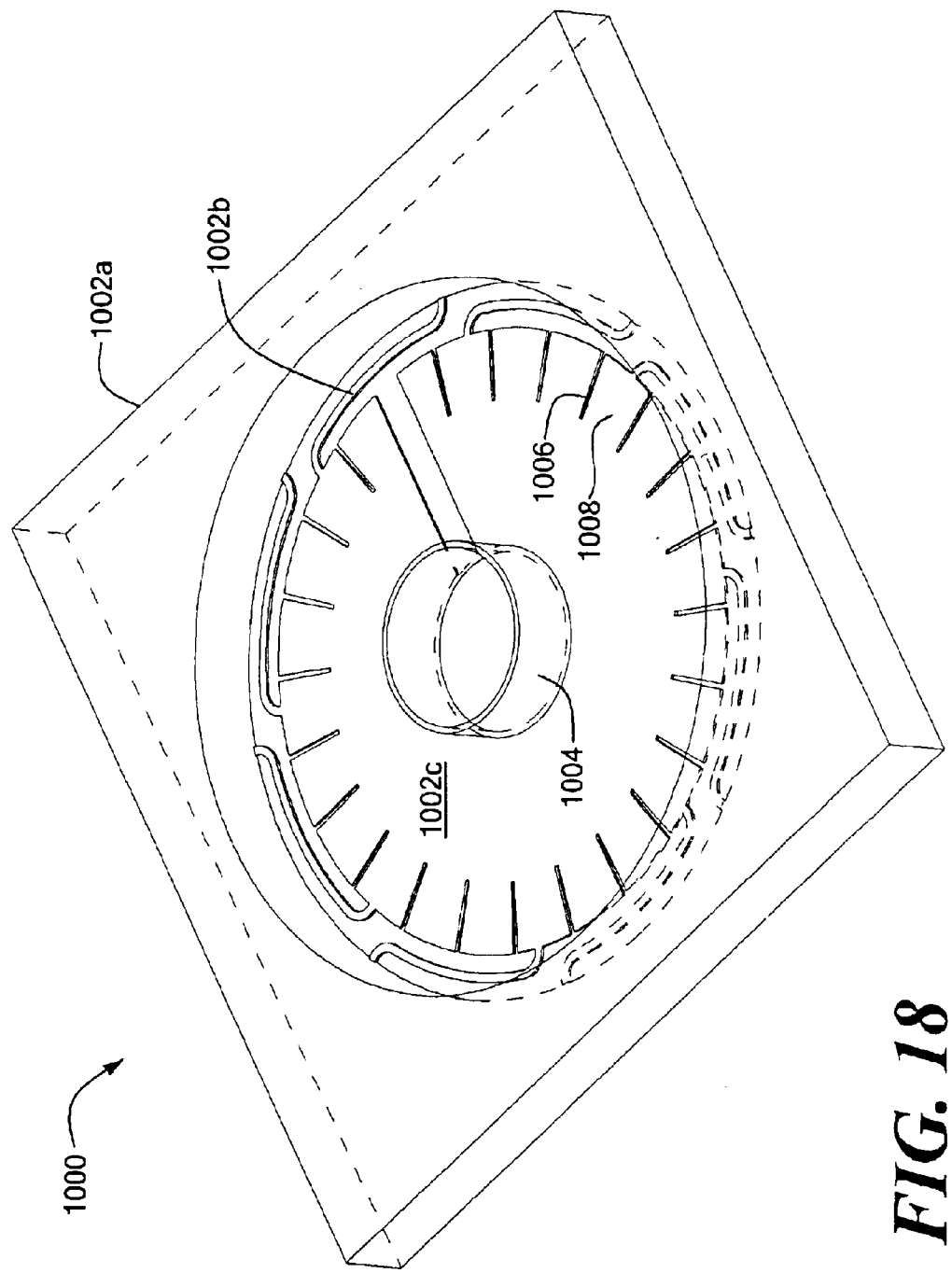
FIG. 18 is a perspective view of a diaphragm with slits provided therein.

Referring now to FIG. 18, a structure 1000, which can provide a function similar to the first structure 522 of FIG. 7, has a base 1002a, flexure arms, for example the flexure arm 1002b, and a diaphragm 1002c. The structure 1000 also has a support structure 1004 similar to the support structure 530 of FIG. 7. Here however, unlike the first structure 522 of FIG. 7, the diaphragm 1002c can have radial slits, for example the slit 1006, forming segments, for example the segment 1008.

It will be understood that the structure 1000 can be used as part of a circuit component, for example the circuit component 520 of FIG. 7, and in particular as the first structure 522. If each of the segments, for example the segment 1008, has a separate actuator, for example a separate zipper actuator, which is described in conjunction with FIGS. 4, 4A, and 8, an additional control over elastic deformation of the structure 1000 can be obtained. Also the deflection of the structure 1000 can be controlled in steps, for example where zipper actuators associated with selected ones of the segments are energized.

Figure 19:
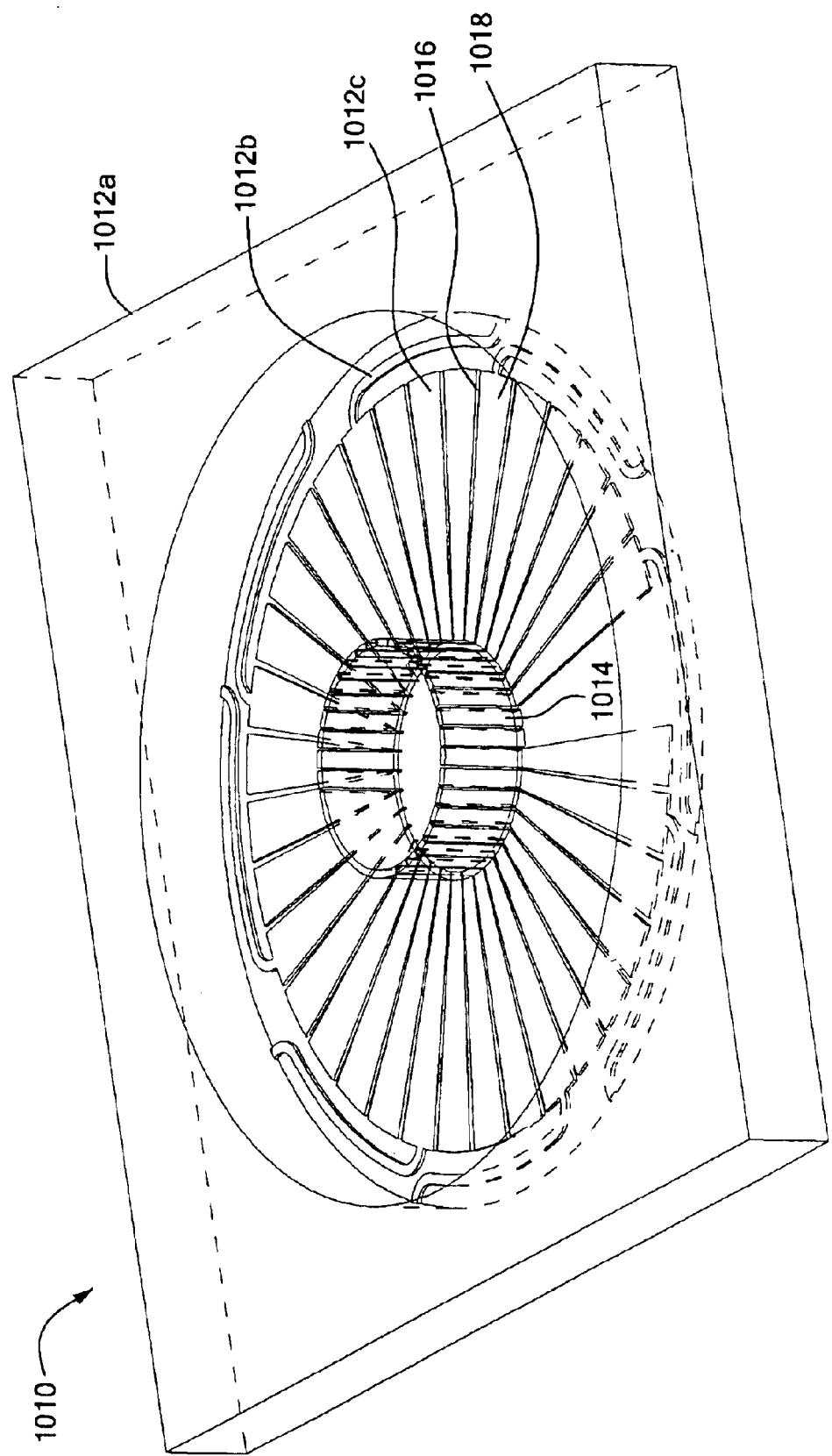
FIG. 19 is a perspective view of another exemplary diaphragm with slits provided therein.

Referring now to FIG. 19, a structure 1010, which can provide a function similar to the first structure 522 of FIG. 7, has a base, 1010a, flexure arms, for example the flexure arm 1010b, and a diaphragm 1010c. The structure 1010 also has a support structure 1014 similar to the support structure 530 of FIG. 7. Here however, unlike the first structure 522 of FIG. 7, the diaphragm 1012c can have radial slits, for example the slit 1016, forming segments, for example the segment 1018.

It will be understood that the structure 1010 can be used as part of a circuit component, for example the circuit component 520 of FIG. 7, and in particular as the first structure 522. If each of the segments, for example the segment 1008, has a separate actuator, for example a separate zipper actuator, which is described in conjunction with FIGS. 4, 4A, and 8, an additional control over elastic deformation of the structure 1000 can be obtained. Also the deflection of the structure 1000 can be controlled in steps, for example where zipper actuators associated with selected ones of the segments are energized.

The longer slits 1016 compared with the slits 1006 of FIG. 18, along with the slits 1016 extending into the support structure 1014 provide a more compliant structure 1010, tending to have higher deflection than the structure 1000 of FIG. 18 in the presence of a force. It will be recognized that, the slits, for example 1006, and the segments, for example 1008, need not have uniform length or area, and could have varying area and varying length.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit component comprising:
   a first structure having first and second opposing surfaces and provided from an elastically deformable material; and
   a second structure having first and second opposing surfaces, with the first surface of said first structure disposed proximate the first surface of said second structure; and
   a support structure disposed between the first surface of said first structure and the first surface of said second structure such that the support structure acts as a fulcrum about which said first structure can be elastically deformed, causing at least a portion of the first surface of said first structure to move relative to the first surface of said second structure.

2. The circuit component of claim 1, further comprising:
   a conductor disposed on the first surface of said first structure in a first conductive region; and
   a conductor disposed on the first surface of said second structure in a second conductive region, wherein the first conductive region and the second conductive region are separated by a gap, forming a capacitor.

3. The circuit component of claim 2, wherein the capacitor has a capacitance which varies in proportion to variations of the gap formed between the first conductive region and the second conductive region in response to elastic deformation of said first structure.

4. The circuit component of claim 2, further comprising:
   a conductor disposed on the first surface of said first structure in a third conductive region coupled to the first conductive region;
   a conductor disposed on the first surface of said second structure in a fourth conductive region coupled to the second conductive region, wherein the third and fourth conductive regions form an inductor in parallel with the capacitor.

5. The circuit component of claim 4, wherein the capacitor has a capacitance which varies in proportion to variations of the gap formed between the first conductive region and the second conductive region in response to elastic deformation of said first structure, and wherein the inductor has an inductance, which is essentially constant.

6. The circuit component of claim 1, further including conductive layers disposed on the first surface of each of the first and second structures, forming a zipper actuator adapted to elastically deform the first structure in response to a voltage applied between the conductive layers.

* * * * *

UNITED STATES PATENT AND TRADEMARK OFFICE
CERTIFICATE OF CORRECTION

PATENT NO. : 6,914,785 B1
APPLICATION NO. : 10/683569
DATED : July 5, 2005
INVENTOR(S) : Alexander H. Slocum et al.

It is certified that error appears in the above-identified patent and that said Letters Patent is hereby corrected as shown below:

Title page, item [57]

ABSTRACT, line 4 delete "acts a fulcrum" and replace with --acts as a fulcrum--.

Column 2, line 34 delete "(GEMS)" and replace with --(MEMS)--.

Column 4, line 16 delete "portion the tank" and replace with --portion of the tank--.

Column 6, line 43 delete "UTHF" and replace with --UHF--.

Column 8, line 20 delete "can operating" and replace with --can operate--.

Column 9, line 12 delete "(FIG. 4, 4A, 8)" and replace with --(FIGS. 4, 4A, 8)--.

Column 9, line 64 delete "second conductive regions 90" and replace with --second conductive region 90--.

Column 10, line 41 delete "second structure are 400b are" and replace with --second structure 400b are--.

Column 10, line 62 delete "region 10a" and replace with --region 101a--.

Column 13, line 26 delete "other dimension" and replace with --other dimensions--.

Column 13, line 45 delete "$\varepsilon = 8.85 \times 10^{-12} \, C^2/N \cdot n$ : Permittivity of air;" and replace with --$\varepsilon = 8.85 \times 10^{-12} \, C^2/N \cdot m^2$ : Permittivity of air;--.

Column 13, lines 61-65 delete "
$$W = \frac{r}{g}$$
$$R = \frac{r-a}{\lambda-a'}$$
" and replace with --
$$W = \frac{r}{g}$$
$$R = \frac{r-a'}{\lambda-a}$$
--.

UNITED STATES PATENT AND TRADEMARK OFFICE
CERTIFICATE OF CORRECTION

PATENT NO. : 6,914,785 B1
APPLICATION NO. : 10/683569
DATED : July 5, 2005
INVENTOR(S) : Alexander H. Slocum et al.

It is certified that error appears in the above-identified patent and that said Letters Patent is hereby corrected as shown below:

Column 14, lines 13-21 delete "$W(0) = \delta = 0$, $W(0) = \phi$, $W(1) = 1$, $W(1) = 0$, $W(1) = 1$" and replace with -- $W(0) = \delta = 0$, $\dot{W}(0) = \phi$, $W(1) = 1$, $\dot{W}(1) = 0$, $\ddot{W}(1) = 0$ --.

Column 14, lines 56-60 delete "and hence, $y(0) = \dfrac{M_2}{\alpha D} = \phi$." and replace with --and hence, $\dot{y}(0) = \dfrac{M_2}{\alpha D} = \phi$. --.

Column 15, line 23 delete " $z(a) = \dfrac{C_1}{2}a$ " and replace with -- $\dot{z}(a) = \dfrac{C_1}{2}a$ --.

Column 16, line 9 delete "is filly" and replace with --is fully--.

Column 17, line 40 delete "714a, 714a" and replace with --714a, 714b--.

Column 19, line 20 delete "circuit, component" and replace with --circuit component--.

Column 19, line 59 delete "Also at 30 this step," and replace with --Also at this step,--.

Column 20, line 7 delete "is deposited of a surface" and replace with --is deposited on a surface--.

Column 20, line 18 delete "appreciated the joint 900" and replace with --appreciated that the joint 900--.

Column 20, lines 42-48 delete the entire paragraph and replace with --In a process step 950b, the substrate 952 is etched, for example wet etched, to form a cavity 958. A metal electrode layer 960 is deposited into the cavity 958 and an insulator, for example, a low-temperature oxide insulator layer 962, is grown on the electrode layer 960. The metal electrode layer 960 is used to form a portion of a zipper actuator, for example the zipper actuator region 524 of FIG. 8.--.

UNITED STATES PATENT AND TRADEMARK OFFICE
CERTIFICATE OF CORRECTION

PATENT NO. : 6,914,785 B1
APPLICATION NO. : 10/683569
DATED : July 5, 2005
INVENTOR(S) : Alexander H. Slocum et al.

It is certified that error appears in the above-identified patent and that said Letters Patent is hereby corrected as shown below:

Column 21, line 13 delete "appreciated the bond 990," and replace with --appreciated that bond 990,--.

Column 21, line 26 delete "in other embodiment," and replace with --in other embodiments,--.

Signed and Sealed this

Seventeenth Day of October, 2006

JON W. DUDAS
*Director of the United States Patent and Trademark Office*